(12) United States Patent
Lai et al.

(10) Patent No.: US 8,119,481 B2
(45) Date of Patent: Feb. 21, 2012

(54) HIGH-κ CAPPED BLOCKING DIELECTRIC BANDGAP ENGINEERED SONOS AND MONOS

(75) Inventors: Sheng-Chih Lai, Taichung (TW);
Hang-Ting Lue, Hsinchu (TW);
Chien-Wei Liao, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/881,570

(22) Filed: Sep. 14, 2010

(65) Prior Publication Data
US 2011/0003452 A1   Jan. 6, 2011

Related U.S. Application Data

(62) Division of application No. 12/182,318, filed on Jul. 30, 2008, now Pat. No. 7,816,727.

(60) Provisional application No. 60/968,076, filed on Aug. 27, 2007, provisional application No. 61/019,178, filed on Jan. 4, 2008.

(51) Int. Cl.
*H01L 21/336* (2006.01)

(52) U.S. Cl. ........ 438/258; 438/287; 438/288; 257/324; 257/325; 257/E21.423; 257/E29.309

(58) Field of Classification Search .................. None
See application file for complete search history.

(56) References Cited

U.S. PATENT DOCUMENTS

| | | | |
|---|---|---|---|
| RE31,083 E | 11/1982 | DeKeersmaecker et al. | |
| 4,630,086 A | 12/1986 | Sato et al. | |
| 5,286,994 A | 2/1994 | Ozawa et al. | |
| 5,319,229 A | 6/1994 | Shimoji et al. | |
| 5,952,692 A | 9/1999 | Nakazato et al. | |
| 6,011,725 A | 1/2000 | Eitan | |

(Continued)

FOREIGN PATENT DOCUMENTS

CN        1909250 A         2/2007

(Continued)

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

(Continued)

*Primary Examiner* — Zandra Smith
*Assistant Examiner* — Khanh Duong
(74) *Attorney, Agent, or Firm* — Haynes Beffel & Wolfeld LLP

(57) ABSTRACT

A blocking dielectric engineered, charge trapping memory cell includes a charge trapping element that is separated from a gate by a blocking dielectric including a buffer layer in contact with the charge trapping element, such as silicon dioxide which can be made with high-quality, and a second capping layer in contact with said one of the gate and the channel. The capping layer has a dielectric constant that is higher than that of the first layer, and preferably includes a high-κ material. The second layer also has a conduction band offset that is relatively high. A bandgap engineered tunneling layer between the channel and the charge trapping element is provided which, in combination with the multilayer blocking dielectric described herein, provides for high-speed erase operations by hole tunneling. In an alternative, a single layer tunneling layer is used.

13 Claims, 26 Drawing Sheets

U.S. PATENT DOCUMENTS

| | | | |
|---|---|---|---|
| 6,026,026 | A | 2/2000 | Chan et al. |
| 6,074,917 | A | 6/2000 | Chang et al. |
| 6,169,693 | B1 | 1/2001 | Chan et al. |
| 6,218,700 | B1 | 4/2001 | Papadas et al. |
| 6,469,343 | B1 | 10/2002 | Miura et al. |
| 6,512,696 | B1 | 1/2003 | Fan et al. |
| 6,605,840 | B1 | 8/2003 | Wu |
| 6,617,639 | B1 | 9/2003 | Wang et al. |
| 6,709,928 | B1 | 3/2004 | Jenne et al. |
| 6,720,630 | B2 | 4/2004 | Mandelman et al. |
| 6,740,928 | B2 | 5/2004 | Yoshii et al. |
| 6,784,480 | B2 | 8/2004 | Bhattacharyya |
| 6,815,764 | B2 | 11/2004 | Bae et al. |
| 6,818,558 | B1 | 11/2004 | Rathor et al. |
| 6,858,906 | B2 | 2/2005 | Lee et al. |
| 6,897,533 | B1 | 5/2005 | Yang et al. |
| 6,912,163 | B2 | 6/2005 | Zheng et al. |
| 6,977,201 | B2 | 12/2005 | Jung |
| 7,012,299 | B2 | 3/2006 | Mahajani et al. |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,154,143 | B2 | 12/2006 | Jung et al. |
| 7,164,603 | B2 | 1/2007 | Shih et al. |
| 7,187,590 | B2 | 3/2007 | Zous et al. |
| 7,391,075 | B2 * | 6/2008 | Jeon et al. ............... 257/316 |
| 7,419,888 | B2 * | 9/2008 | Yang et al. .............. 438/479 |
| 7,442,988 | B2 | 10/2008 | Oh et al. |
| 7,473,589 | B2 | 1/2009 | Lai et al. |
| 7,479,425 | B2 | 1/2009 | Ang et al. |
| 7,576,386 | B2 | 8/2009 | Lue et al. |
| 7,592,666 | B2 | 9/2009 | Noguchi et al. |
| 7,612,403 | B2 | 11/2009 | Bhattacharyya |
| 7,646,056 | B2 | 1/2010 | Choi et al. |
| 7,663,177 | B2 * | 2/2010 | Lin et al. ............... 257/315 |
| 7,732,856 | B2 | 6/2010 | Sim et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0224564 | A1 | 12/2003 | Kang et al. |
| 2004/0079983 | A1 | 4/2004 | Chae et al. |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0062098 | A1 | 3/2005 | Mahajani et al. |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2005/0285184 | A1 | 12/2005 | Jung |
| 2006/0118858 | A1 | 6/2006 | Jeon et al. |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029601 | A1 | 2/2007 | Orimoto et al. |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |
| 2007/0120179 | A1 | 5/2007 | Park et al. |
| 2007/0138539 | A1 | 6/2007 | Wu et al. |
| 2007/0176227 | A1 | 8/2007 | Liu et al. |
| 2008/0076224 | A1 | 3/2008 | Ryu et al. |
| 2008/0093661 | A1 | 4/2008 | Joo et al. |
| 2008/0099830 | A1 | 5/2008 | Lue et al. |
| 2008/0116506 | A1 | 5/2008 | Lue |
| 2008/0157184 | A1 | 7/2008 | Lai et al. |
| 2009/0039414 | A1 | 2/2009 | Lue et al. |
| 2009/0039416 | A1 | 2/2009 | Lai et al. |
| 2009/0039417 | A1 | 2/2009 | Chen et al. |

FOREIGN PATENT DOCUMENTS

| | | |
|---|---|---|
| EP | 0016246 | 10/1980 |
| EP | 1411555 | 4/2004 |
| EP | 01677311 A1 | 7/2006 |
| EP | 01677312 A1 | 7/2006 |
| JP | 11040682 A | 2/1999 |
| JP | 2004363329 | 12/2004 |

OTHER PUBLICATIONS

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chang, Sung-Il, et al., "Reliability Characteristics of Tanos (TaN/AlO/SiN/Oxide/Si) NAND Flash Memory with Rounded Corner (RC) Structure," IEEE 2008, 3 pages.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "Variot: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Intl Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lai, Sheng-Chih, et al., "MA BE-SONOS: A Bandgap Engineered SONOS using Metal Gate and Al2O3 Blocking Layer to Overcome Erase Saturation," IEEE Non-Volatile Semiconductor Memory Workshop, Aug. 26-30, 2007, pp. 88-89.

Lee, Chang, et al., "A Novel SONOS Structure of SiO2/SiN/Al2O3 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Likharev, "Layered Tunnel Barriers for Nonvolatile Memory Devices, "Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38 (11) Nov 19912519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Park, Youngwoo, et al., "Highly Manufacturable 32Gb Multi-Level NAND Flash Memory with 0.0098 um2 Cell Size using TANOS (Si-Oxide-Al2O3-TaN) Cell Technology," IEEE IEDM, Dec. 11-13, 2006, 4 pages.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search report mailed Nov. 14, 2007 in European Application No. 06000064.3 (Pub. No. EP-01677312) filed on Jan. 3, 2006, 4 pages.

Search report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Shin, Yoocheol, et al., "A Novel NAND-Type MONOS Memory Using 63nm Process Technology for Multi-Gigabit Flash EEPROMs," IEEE 2005, 4 pages.

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tsai et al., "Novel SONOS-Type Nonvolatile Memory Device with Suitable Band Offset in HfAlO Charge-Trapping Layer," Intl'l Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wang, Szu-Yu et al., "Reliability and Processing Effects of Bandgap Engineered SONOS (BE-SONOS) Flash Memory," Physics Symposium, 2007, Proc. 45th Annual IEEE Intl, Apr. 15-19, 2007, 171-176.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "Phines: A Novel Low Power Program/Erase, Small Pitch 2-Bit per Cell Flash Memory," IEDM Tech. Dig. 2002, 931-934.

Shin, Yoocheol, et al., "High Reliable SONOS-type NAND Flash Memory Cell with Al2O3 for Top Oxide," NVSMW Workshop 2003, 2 pages.

Search Report from EP 08252762 mailed Jan. 18, 2010 6 pages.

* cited by examiner

HIGH-κ CAPPED BLOCKING DIELECTRIC BANDGAP ENGINEERED SONOS AND MONOS

CROSS REFERENCE TO RELATED APPLICATIONS

The present application is a divisional of co-pending U.S. patent application Ser. No. 12/182,318 filed on 30 Jul. 2008, which application claims the benefit of U.S. Provisional Patent Application No. 60/968,076, filed on 27 Aug. 2007, and of U.S. Provisional Patent Application No. 61/019,178, filed on 4 Jan. 2008, each of which is incorporated by reference as if fully set forth herein.

BACKGROUND OF THE INVENTION

1. Field of the Invention

The present invention relates to flash memory technology, and more particularly to scalable charge trapping memory technology adaptable for high speed erase and program operations.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical charge trapping memory cell consists of a field effect transistor FET structure having a source and drain separated by a channel, and a gate separated from the channel by a stack of dielectric material including a tunnel dielectric layer, the charge storage layer, and a blocking dielectric layer. According to the early conventional designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed a silicon oxide (O), and the gate comprises polysilicon (S). The SONOS device is programmed by electron tunneling using one of a number of well-known biasing technologies, and erased by hole tunneling or electron de-trapping. In order to achieve practical operational speeds for the erase operation, the tunneling dielectric layer must be quite thin (less than 30 Å). However at that thickness, the endurance and charge retention characteristics of the memory cell are poor relative to traditional floating gate technology. Also, with relatively thick tunneling dielectric layers, the electric field required for the erase operation also causes electron injection from the gate through the blocking dielectric layer. This electron injection causes an erase saturation condition in which the charge level in the charge trapping device converges on an equilibrium level. See, U.S. Pat. No. 7,075,828, entitled "Operation Scheme with Charge Balancing Erase for Charge Trapping Non-Volatile Memory", invented by Lue et al. However, if the erase saturation level is too high, the cell cannot be erased at all, or the threshold margin between the programmed and erased states becomes too small for many applications.

Technology has been investigated to improve the ability of the blocking dielectric layer to reduce electron injection from the gate for the high electric fields needed for erase. See, U.S. Pat. No. 6,912,163, entitled "Memory Device Having High Work Function Gate and Method of Erasing Same," Invented by Zheng et al., issued 28 Jun. 2005; and U.S. Pat. No. 7,164,603, entitled "Operation Scheme with High Work Function Gate and Charge Balancing for Charge Trapping Non-Volatile Memory", invented by Shih et al., Shin et al., "High Reliable SONOS-type NAND Flash Memory Cell with $Al_2O_3$ or Top Oxide," NVSMW, 2003; and Shin et al., "A Novel NAND-type MONOS Memory using 63 nm Process Technology for a Multi-Gigabit Flash EEPROMs", IEEE 2005. In the just-cited references, the second Shin et al. article describes a SONOS type memory cell in which the gate is implemented using tantalum nitride and the blocking dielectric layer is implemented using aluminum oxide (referred to as the TANOS device), which maintains a relatively thick tunneling dielectric layer at about 4 nm. The relatively high work function of tantalum nitride inhibits electron injection through the gate, and the high dielectric constant of aluminum oxide reduces the magnitude of the electric field through the blocking dielectric layer relative to the electric field for the tunneling dielectric layer. Shin et al. report a trade-off between the breakdown voltage of the memory cell, the thickness of the aluminum oxide layer and the thickness of the tunneling dielectric layer. With a 4 nm thick silicon dioxide tunneling dielectric in a TANOS device, relatively high erase voltages are proposed in order to achieve erase speeds. An increase in erase speeds would require increasing the voltages applied or decreasing the thickness of the tunneling dielectric layer. Increasing the voltage applied for erase is limited by the breakdown voltage. Decreasing the thickness of the tunneling dielectric layer is limited by issues of charge retention, as mentioned above.

On the other hand, technology has been investigated to improve the performance of the tunneling dielectric layer for erase at lower electric fields. See, U.S. Patent Application Publication No. US 2006/0198189 A1, "Non-Volatile Memory Cells, Memory Arrays Including the Same and Method of Operating Cells and Arrays," Invented by Lue et al., publication date Sep. 7, 2006 (describing a "BE-SONOS device"); Lue et al., "BE-SONOS: A Bandgap Engineered SONOS with Excellent Performance and Reliability", IEEE, December 2005; Wang et al., "Reliability and Processing Effects of the Bandgap Engineered SONOS (BE-SONOS) Flash Memory", IEEE, May 2007. See also, U.S. Patent Application Publication No. 2006/0261401 A1, entitled "Novel Low Power Non-Volatile Memory and Gate Stack", by Bhattacharyya, published 23 Nov. 2006.

BE-SONOS technology has been proven to provide excellent performance, overcoming many of the erase speed, endurance and charge retention issues of prior art SONOS type memory. However, the problem of the erase saturation continues to limit operational parameters of the device. Furthermore, as the device sizes shrink, it is expected that erase saturation problems will intensify.

These prior art technologies have emphasized the advantages of high-κ dielectrics, where the dielectric constant κ is greater than 7, like aluminum oxide. The higher dielectric constant can improve performance by enhancing the program and erase speed, improving the threshold voltage window for the cells, and reducing the operating voltage during program and erase by reducing the effective oxide thickness EOT, which is defined as the thickness of the layer scaled by the ratio of the dielectric constant of silicon dioxide to the dielectric constant of the material. However, it is difficult to manufacture high-κ materials like aluminum oxide with high quality. In addition, the charge trapping efficiency of the charge trapping layer can vary with changes in the material of the blocking dielectric. For example, it has been believed that the silicon nitride/silicon oxide interface provides "deep" charge trapping states that resist charge leakage. See, Fujiwara et al., Japanese Patent Application Publication No. 11-040682, published 12 Feb. 1999. Therefore, the use of high-κ materials for the blocking dielectric comes with the trade-off of greater electron de-trapping current than might occur if the lower κ, and higher quality, silicon dioxide were used. Of course, the use of silicon dioxide for the blocking layer results in the problem of high threshold erase saturation, because of the relatively high electric field magnitude in the lower κ material.

One prior art technology that has been attempted to address the issue of high threshold voltage erase saturation is described in Noguchi et al, U.S. Patent Application Publication No. US 2005/0006696, published Jan. 13, 2005. Noguchi et al. proposes a multilayer blocking dielectric structure that includes a secondary charge trapping layer. According to Noguchi et al., by trapping some electrons in the secondary charge trapping layer, the magnitude of the electric field across the blocking dielectric structure is reduced, tending to reduce electron injection to the primary charge trapping layer during an erase operation. In this way, according to Noguchi et al., a lower erase saturation is achieved.

In our commonly owned, and co-pending U.S. patent application entitled CHARGE TRAPPING MEMORY CELL WITH HIGH SPEED ERASE, application Ser. No. 11/845,276, filed 27 Aug. 2007, a memory cell is described in which the blocking dielectric layer comprises a high-κ material, such as aluminum oxide, combined with a BE-SONOS tunneling layer. The high-κ blocking dielectric tends to reduce the magnitude of the electric field across it, and therefore reduces electron injection during erase operations based on hole injection from the channel. However, such high-κ materials tend to have defects, requiring that they be made relatively thick to prevent charge leakage or other reliability problems. Our commonly owned, and co-pending U.S. patent application entitled BLOCKING DIELECTRIC ENGINEERED CHARGE TRAPPING MEMORY CELL WITH HIGH SPEED ERASE, application Ser. No. 11/845,321, filed 27 Aug. 2007, describes the use of metal-doped silicon dioxide, taking advantage of the ability to form high quality silicon dioxide films with doping to increase the dielectric constant of the layer.

In general, the problem of electron injection from the gate during an erase bias intended to cause hole tunneling from the channel, which causes erase saturation, arises from the need to have a relatively high electric field in the tunneling layer. This high field in the tunneling layer requires a high field in the blocking layer as well. So, increasing the dielectric constant of the blocking layer tends to improve operation by reducing the magnitude of the electric field within the blocking layer. However, because the high-κ blocking layer must be thicker than would be needed with the standard silicon dioxide layer, the magnitude of the electric field in the tunneling layer is reduced. Therefore, the benefits of these prior techniques are limited by the need to provide a thicker blocking dielectric layer.

U.S. Patent Application Publication No. US 2003/0047755 A1, by Lee et al. proposes the use of a multilayer blocking dielectric layer while trying to minimize the effective oxide thickness of the blocking layer in FIGS. 5-7. In US 2003/0047755A1, the purpose of high-κ blocking oxide is to reduced the effective oxide thickness EOT of the stack between the channel and the gate for a given physical thickness, and to reduce gate injection (see, paragraphs 0034-0042). In order to reduce the EOT according to the concept in US 2003/0047755A1, a multilayer blocking dielectric layer would use a high relative thickness for the high-κ layer relative to the buffer layer. However, a thin buffer oxide layer does not appear to provide substantial gains in retention and reliability without significant increases on the overall actual thickness of the blocking dielectric layer. Furthermore, recent studies of the use of high-κ dielectrics show poor data retention for such cells, as shown for example by FIG. 7, of Chang et al., Reliability Characteristics of TANOS (TaN/AlO/SiN/Oxide/Si) NAND Flash Memory with Rounded Corner (RC) Structure", Non-Volatile Semiconductor Memory Workshop, 2008 and 2008 International Conference on Memory Technology and Design. NVSMW/ICMTD 2008. Joint, 18-22 May 2008, Pages: 117-118.

Accordingly, is desirable to provide a new memory technology which is readily manufactured with high quality, and overcomes the reliability and data retention issues of prior art technologies, and that can be applied in very small memory devices.

SUMMARY OF THE INVENTION

A blocking dielectric engineered, charge trapping memory cell is described having a dielectric stack between the gate and the channel including a charge trapping element that is separated from a gate by a blocking dielectric comprising a first layer in contact with the charge trapping element, such as silicon dioxide which can be made with high-quality, and a second layer in contact with said one of the gate and the channel, in which the second layer has a dielectric constant that is higher than that of the first layer, and preferably comprises a high-κ material, and more preferably a material having a dielectric constant more than 7. As described herein, the second layer has a dielectric constant $\kappa_2$ higher than $\kappa_1$ of the first layer, and the second layer has a thickness less than $\kappa_2/\kappa_1$ times that of the first layer. This thickness relationship provides for use of a relatively thick first layer acting as a buffer layer, improving overall reliability, including charge retention, endurance and disturb characteristics of the device, while suppressing gate injection to reduce erase saturation levels.

As discussed in detail below, the electron barrier height and dielectric constant are both high in the interface with the gate, tending to suppress electron injection from the gate, while the layer contacting the charge trapping element acts as a buffer, masking defects in the other layer improving charge retention.

A bandgap engineered tunneling layer between the channel and the charge trapping element is provided in embodiments described herein, which, in combination with the multilayer blocking dielectric described herein, provides for high-speed erase operations by hole tunneling.

Thus, a new memory cell is described having a multilayer blocking dielectric structure and a bandgap engineered tunneling layer that enables fast programming and fast erase without erase saturation, with excellent reliability and retention characteristics. A process for manufacturing the memory cell is described, which includes forming the multilayer blocking dielectric combined with a bandgap engineered tunneling layer.

Although the embodiments described herein have the blocking dielectric layer between the charge trapping element and the gate and the tunneling layer between the channel and the charge trapping element, the memory cell can also be inverted, so that it is made with the blocking dielectric contacting the channel and the tunneling layer contacting the gate.

The technology is combined in the memory described here with a bandgap engineered tunneling dielectric that includes a combination of materials having negligible charge trapping efficiency, and band offset characteristics. The band offset characteristics include a relatively large hole tunneling barrier height in a thin region at the interface with the semiconductor body, and an increase in valence band energy level so that the hole tunneling barrier height at a first location, less than 2 nanometers (nm) for example from the channel surface, is relatively low. The band offset characteristics also include an increase in conduction band energy by providing a thin layer of relatively high electron tunneling barrier height at a second location more than 2 nm from the channel surface, separating the material with a relatively lower hole tunneling barrier height from the charge trapping layer.

An oxide buffer layer between high-k top dielectric (such as $Al_2O_3$) and nitride-trapping layer for charge-trapping devices, as described herein results in a memory cells with better reliability performance. On the other hand, high-k top dielectric can relieve the electric field and suppress the gate injection during erase. Since the gate injection is determined by the interface of gate and $Al_2O_3$, the insertion of oxide buffer layer does not change the erase mechanism. In fact, the oxide buffer layer shows dramatically improved retention and read disturb reliabilities. This oxide buffer layer greatly improves the reliability performances of MA BE-SONOS devices.

High-κ top dielectrics are widely considered as a "must" in charge-trapping devices. The original thinking [C. H. Lee et al, *IEDM Tech. Dig.*, pp. 26.5.1-26.5.4, 2003] was an analogy in floating gate device, where gate coupling ratio (GCR) can be increased by using higher-k inter-poly dielectric. However, charge-trapping devices are designed in planar structure and do not depend on the same kind of gate coupling ratio engineering, as do floating gate cells. In fact, for the charge trapping device with a planar structure, the electric field in bottom tunnel oxide is simply determined by $|V_G-V_T|/EOT$ (where EOT is effective oxide thickness), and independent of the top dielectric. On the other hand, most current MANOS structures uses relatively thick $Al_2O_3$ as the blocking layer (to prevent leakage) and have a large EOT (~15 nm) [Y. Shin et al, *IEDM Tech. Dig.*, pp. 327-330, 2005]. Such large EOT should not help in program/erase speed according to the theory.

The actual role of high-k top dielectric is believed to be suppression of gate injection during erase [S. C. Lai et al, *VLSI-TSA*, pp. 14-15, 2007. S. C. Lai et al, *IEEE NVSMW*, pp. 88-89, 2007]. A higher-k top dielectric has lower electric field during erase. If the conduction band offset between metal gate and top dielectric (barrier height) is high enough, the gate injection during erase can be greatly suppressed. The actual erase mechanism of MANOS is believed to come from the electron de-trapping (just like MONOS with a thick tunnel oxide) [S. C. Lai et al, *VLSI-TSA*, pp. 14-15, 2007]. The suppression of gate injection using $Al_2O_3$ allows very large electric field (>16 MV/cm) to increase the electron de-trapping. However, such large electric field results in serious degradation of the device, and approaches dielectric breakdown [Y. Shin et al, *IEDM Tech. Dig.*, pp. 327-330, 2005].

A memory cell comprising a metal gate, aluminum oxide blocking layer and bandgap engineered tunneling layer MA BE-SONOS [S. C. Lai et al, *IEEE NVSMW*, pp. 88-89, 2007] is described in our co-pending U.S. patent application Ser. No. 11/845,276, filed on 27 Aug. 2007. Such cell is shown to provide fast erase speed without erase saturation. A band engineered ONO barrier is used to provide efficient hole tunneling erase. However, we find that the introduction of $Al_2O_3$ top dielectric significantly degrades the data retention. It is believed that the $Al_2O_3$ is the root cause of charge leakage. In order to solve this issue, we insert an oxide buffer layer between $Al_2O_3$ and nitride. This new structure is thus essentially a BE-SONOS [H. T. Lue et al, *IEDM Tech. Dig.*, pp. 22.3.1-22.3.4, 2005] structure with an $Al_2O_3$ top-capping layer. Since the gate injection is dominated by the interface of gate and $Al_2O_3$, the insertion of oxide buffer layer does not change the erase mechanism. On the other hand, reliability performance is significantly improved. Furthermore, a relatively thin layer of aluminum oxide is sufficient to suppress gate injection, so that the thickness of the oxide buffer layer can be more than half the thickness of the aluminum oxide layer. The thickness of the buffer layer is generalized as explained above for use of other high-k materials, by the relation the second layer has to dielectric constant $\kappa_2$, which is higher than $\kappa_1$ of the first layer, and the second layer has a thickness less than $\kappa_2/\kappa_1$ times that of the first layer.

The present technology combines techniques for reducing the electric field in the multilayer blocking dielectric layer, maintaining a relatively high conduction band offset at the gate or channel interface and maintaining a high quality interface (relatively defect free) between the charge trapping element and the multilayer blocking dielectric layer. As a result, the advantage of high-κ material is achieved while maintaining a thinner blocking dielectric stack. The multilayer blocking dielectric layer is further combined with techniques for reducing the magnitude of the electric field required for erase to achieve high speed erase operations without saturation, enabling a large memory window compared to prior devices. Also, charge retention and endurance characteristics of the memory cell are very good. The thinner blocking dielectric stack results in a greater electric field in the tunneling layer for a given voltage, and enables even higher speed erase operations without sacrificing endurance or charge retention characteristics of the memory.

Circuitry is coupled to the array of memory cells to apply bias voltages to selected memory cells for read, program and erase operations, including high speed erase operations causing reduction in cell threshold of more than 2 V in less than 10 msec at operating voltages across the gate and semiconductor body (including the channel and source/drain junctions) of less than 20 V.

The new memory cell structures described herein have good reliability including good data retention and high immunity to read disturbance. The new memory cell structures have lower erase saturation levels and larger memory window since the gate injection can be well suppressed by the high-κ capping layer.

Therefore, this new device is suitable for NAND flash applications beyond 45 nm node.

Other aspects and advantages of the present invention can be seen on review of the drawings, the detailed description in the claims which follow.

DETAILED DESCRIPTION

A detailed description of embodiments of the present invention is provided with reference to the FIGS. 1-34.

Figure 1:
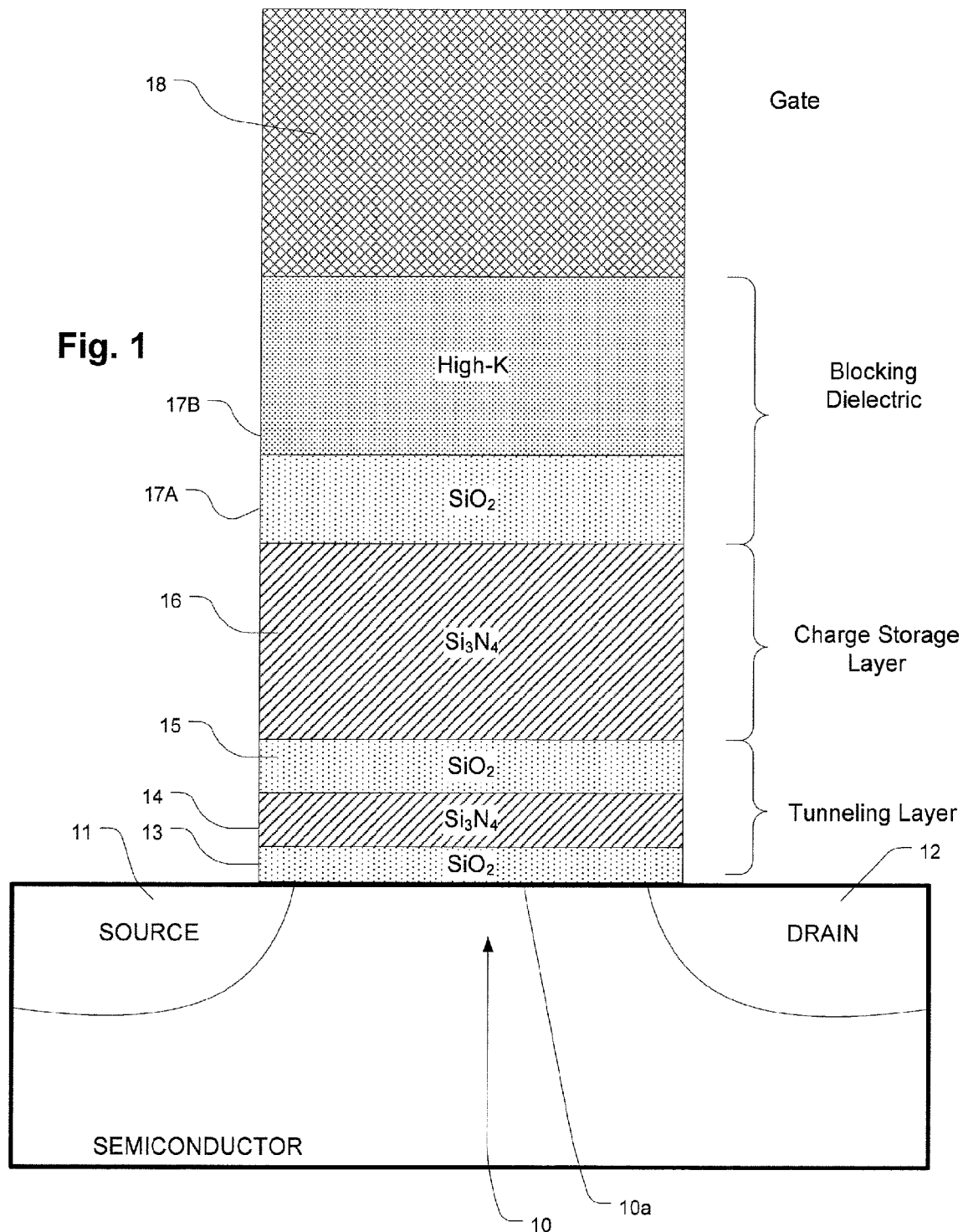
FIG. 1 is a simplified diagram of an embodiment of a memory cell according to the present invention.

FIG. 1 is a simplified diagram of a charge trapping memory cell employing a multilayer blocking dielectric layer and a bandgap engineered dielectric tunneling layer. The memory cell includes a channel 10, a source 11 and a drain 12 adjacent the channel in a semiconductor body. A gate 18 overlies a multilayer stack, including the multilayer blocking dielectric layer, the charge trapping layer and the tunneling layer, of dielectric materials acting as the charge storage structure.

Gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 1, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less. Representative embodiments are 10 Å or 12 Å thick.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling dielectric after the first location. This structure enables electric field assisted hole tunneling at high speeds while effectively preventing charge leakage through the engineered tunneling dielectric in the absence of electric fields or in the presence of smaller electric fields induced for the purpose of other operations, such as reading data from the cell or programming adjacent cells.

In a representative device, the engineered tunneling dielectric layer consists of an ultrathin silicon oxide layer O1 (e.g. <=18 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

Embodiments of the memory cell described herein include gates comprising polysilicon, such as n+ polysilicon, or metal, such as aluminum. In alternatives, the gates comprise materials having work functions that are greater than the work functions of n+ polysilicon, including for example, p+ polysilicon, platinum, tantalum nitride, and other materials chosen for work function, conductivity and manufacturability.

The structure of the dielectric tunneling layer is described in more detail below with reference to FIGS. 2 and 3.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer in this embodiment comprises a stack including a buffer layer 17A and a high-κ capping layer 17B. High-κ herein refers to dielectric constant >7, such as found in materials including $Al_2O_3$, $HfO_2$, $ZrO_2$, $La_2O_3$, AlSiO, HfSiO and ZrSiO etc.

The buffer layer of silicon dioxide can be formed by wet conversion from the nitride by a wet furnace oxidation process. Other embodiments may be implemented using high temperature oxide (HTO) or LPCVD $SiO_2$. An aluminum oxide capping dielectric layer can be made by atomic vapor deposition, with a post rapid thermal anneal at about 900° for 60 seconds to strengthen the film.

Using these processes, a layer of silicon oxide can be formed with very few defects, and a capping layer of high-κ, high conduction band offset material like aluminum oxide, combine to provide a blocking dielectric layer which provides excellent retention characteristics and very low erase saturation voltages. Therefore, the EOT can be reduced and the operation voltage can be lowered.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17A,17B can be of silicon oxide between 5 Å and 90 Å, with a capping layer of aluminum oxide between 5 and 90 Å The gate material can be p+ polysilicon (work function about 5.1 eV). For improved retention characteristics, it is preferred that the layer of silicon oxide have a thickness greater than 30 Å.

Also, it is found that the ratio of the thickness of the top layer 17B to the thickness of the bottom layer 17A of the blocking dielectric layer can be less than 2 for the combination of silicon oxide ($κ_1$=3.9) and aluminum oxide ($κ_2$=about 8). In general, the top layer 17B can have a thickness that is less than the ratio of the dielectric constants thicker than the bottom layer 17A. Thus, the blocking dielectric layer as described herein includes a first layer 17A having a dielectric constant $κ_1$ contacting the charge trapping dielectric layer and a second layer 17B contacting another one of the channel surface and the gate, the second layer 17B having a dielectric constant $κ_2$ higher than $κ_1$ of the first layer, and the second layer having thickness less than $κ_2/κ_1$ times that of the first layer. For aluminum oxide as a top capping layer, the dielectric constant is ~8 and the barrier height or conduction band offset is more than 3 eV to obtain the erase saturation $V_{FB}$<−2V. Since the barrier height of $Al_2O_3$ is almost the same as $SiO_2$, the electron barrier height or conduction band offset of aluminum oxide with N+ polysilicon gate is about 3.1 eV.

In examples of memory cells described herein, in order to get a reasonable operation speed (program and erase) at a voltage of less than 20 volts, the total effective oxide thickness EOT for the multilayer dielectric stack (e.g., High-k-O—N—O—N—O, and High-k-O—N—O) between the gate and the channel should be less than 160 Å. The EOT of a bandgap engineered (BE) ONO tunneling barrier or a single layer $SiO_2$ tunnel oxide is typically in a range of about 40 to 55 Å, and preferably 45 to 50 Å and the EOT of a nitride charge trapping layer is typically in a range of about 25 to 40 Å, and preferably 30 to 35 Å. Therefore, the EOT for the multilayer blocking dielectric layer (e.g. $SiO_2$ buffer layer and $Al_2O_3$) is less than 95 Å, and preferably in a range of about 75 to 85 Å, for the memory cells described herein.

Figure 2:
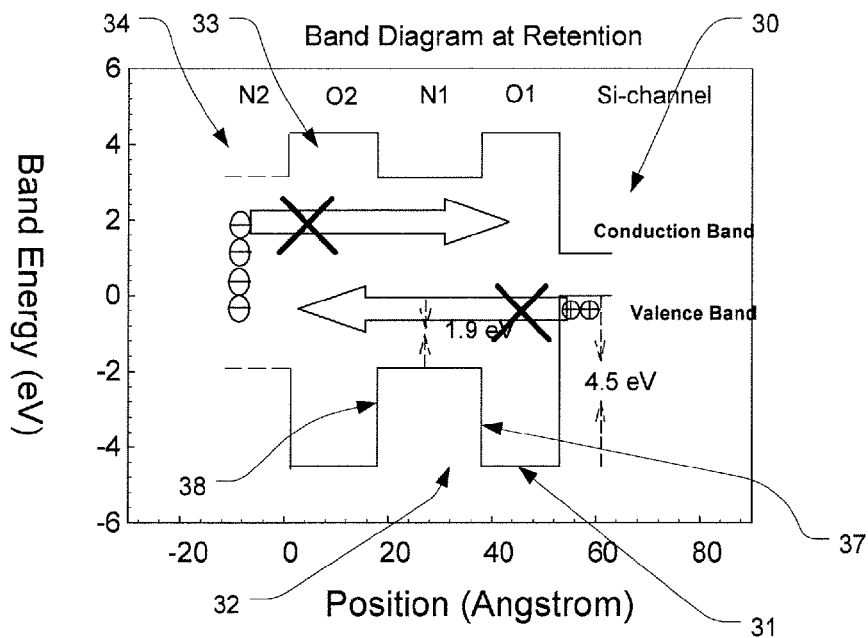
FIG. 2 is a band diagram for a tunneling dielectric layer including band offset technology at low electric fields.

FIG. 2 is a diagram of the energy levels of the conduction and valence bands of the dielectric tunneling structure including the stack of layers 13-15 of FIG. 1 under a low electric field, showing a "U-shaped" conduction band and an "inverted U-shaped" valence band. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2 nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 3:
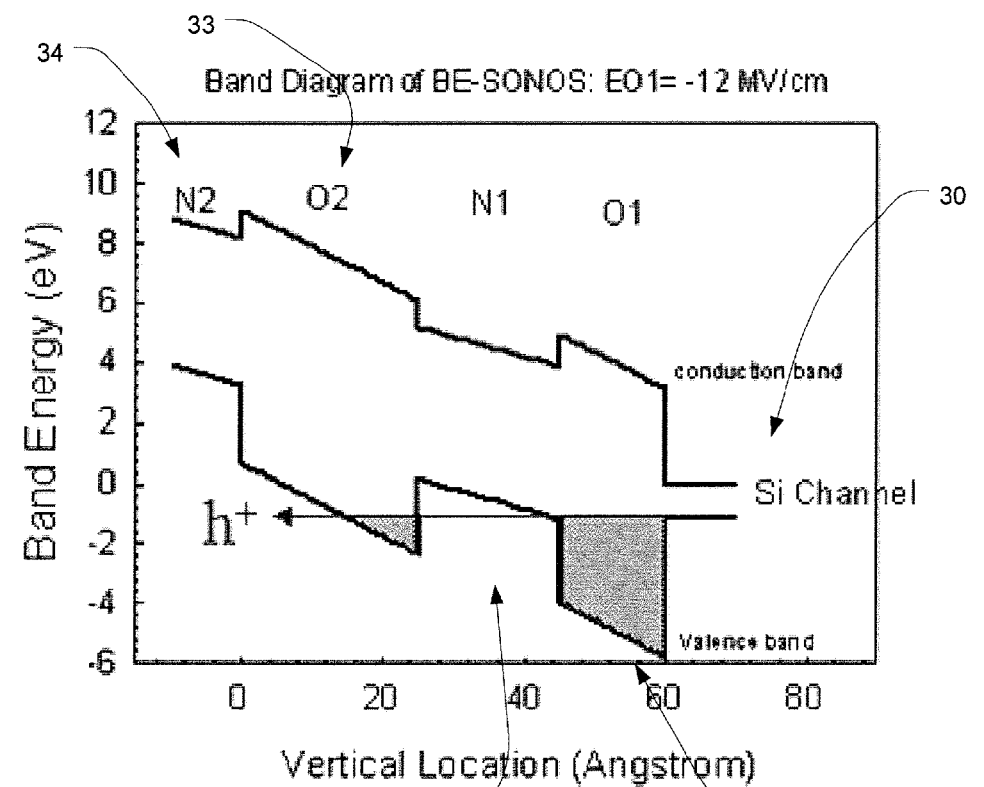
FIG. 3 is a band diagram for a tunneling dielectric layer including band offset technology at high electric fields.

FIG. 3 shows the band diagram for the dielectric tunneling structure under conditions of an electric field of about −12 MV/cm in the tunneling region 31, for the purposes of inducing hole tunneling (in FIG. 3, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in FIG. 3) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

In alternatives, the multilayer tunneling stack may be replaced with a single layer tunneling oxide as used in conventional MONOS devices, or with other tunneling layer structures. It is known that although the conventional MONOS (tunneling oxide >3 nm) has good data retention, its erase saturation level is too high for NAND application because the $SiO_2$ top oxide cannot well suppress the gate injection.

MANOS/TANOS were proposed as referred to above. These structures use an $Al_2O_3$ (k~8) to replace the top oxide (k=3.9). The erase saturation is greatly suppressed, therefore, MANOS device has lower erase saturation level and larger memory window than MONOS. However, the use of a single high-κ top dielectric may introduce new reliability issues. This is because the high-κ dielectric is often more leaky than the conventional $SiO_2$ top oxide. Therefore, the use of a single, high-κ top dielectric does not provide retention reliability.

As described herein, an additional high-κ capping film is capped on the top oxide of MONOS. This new structure has good retention and read disturbance characteristics because the buffer layer has a low leakage current and can form the deep traps in the interface between trapping layer (SiN) and buffer layer (SiO$_2$). Also, the top high-κ film can suppress the gate injection because of its high dielectric constant, so that this new innovation can get a low erase saturation level and large memory window, which are good for NAND flash applications.

Figure 4:
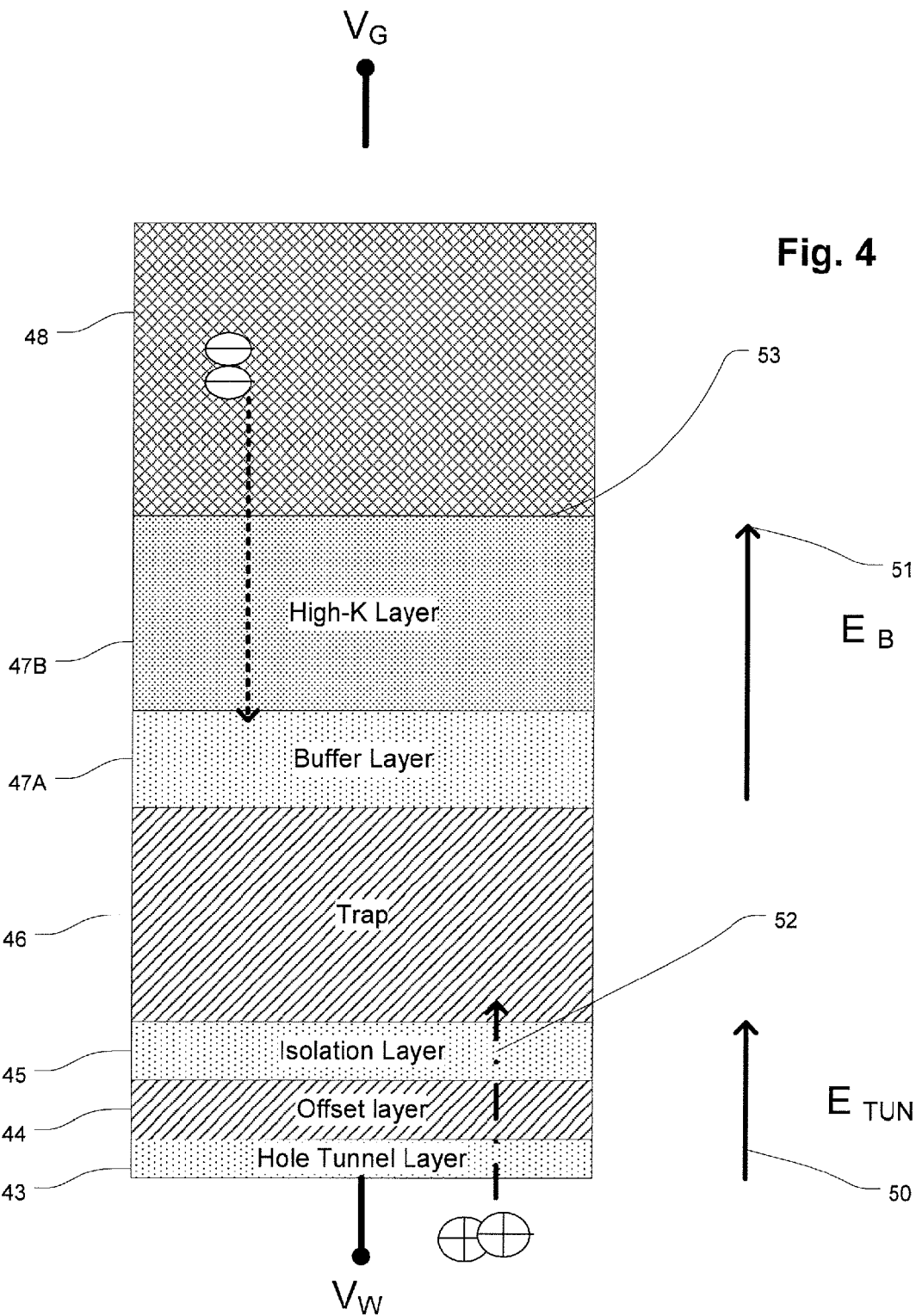
FIG. 4 illustrates the electric fields and tunneling currents during an erase operation for an embodiment of a memory cell according to the present invention.

FIG. 4 is a schematic illustration of the gate stack for a charge trapping memory cell like that in FIG. 1, showing electric field dynamics during an erase process. The gate stack includes a hole tunneling layer 43, a band offset layer 44, and an isolation layer 45 which in combination act as the dielectric tunneling layer for the device. A charge trapping layer 46 is shown on the tunneling dielectric layer. A blocking dielectric layer consisting of a multilayer structure including a buffer layer 47A and a capping layer 47B separates the charge trapping layer 46 from the gate 48. During an erase process, the electric field is induced by bias voltages $V_G$ and $V_W$ applied at the gate and channel of the memory cell, and results in an electric field $E_{TUN}$ 50 through the dielectric tunneling layer 43, 44, 45 and an electric field $E_B$ 51 through the blocking layer 47A/47B. The magnitude of the electric field $E_{TUN}$ 50 through the dielectric tunneling layer is sufficient to induce hole tunneling current 52 into the trapping layer 46. The magnitude of the electric field $E_B$ 51 through the capping layer 47B in the blocking dielectric layer is reduced relative to that through the silicon dioxide in the tunneling dielectric layer because of the higher dielectric constant by an amount that is about 3.9/κ, where 3.9 is the dielectric constant for silicon dioxide and κ is the dielectric constant of the capping layer 47B. Therefore, because of sufficient electron affinity of the gate 48, the relatively lower electric field $E_B$ 51 and the thickness of the blocking dielectric layer 47A/47B, electron tunneling current 53 is effectively blocked, allowing large memory windows without erase saturation effects. Memory devices as taught herein are operable with bias voltages across the gate and semiconductor body low enough that a maximum electric field of 14 MV/cm or less occurs in the tunneling dielectric layer during erase, with a corresponding lower electric field in the blocking dielectric layer.

Figure 5A:
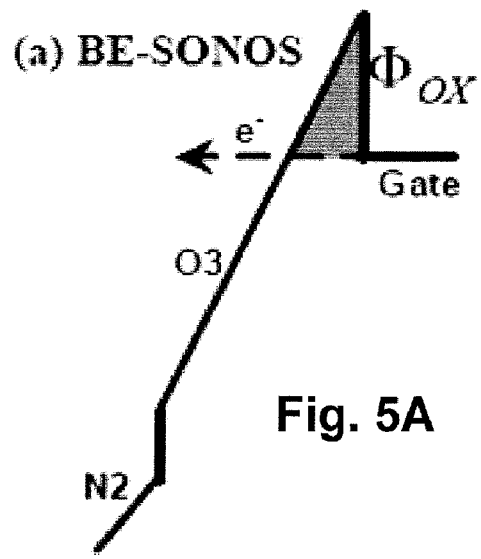
FIGS. 5A through 5D are conduction band diagrams for the blocking dielectric layer of a single silicon dioxide layer (FIG. 5A), a single aluminum oxide layer (FIG. 5B), a first example stacked silicon dioxide/aluminum oxide layer (FIG. 5C), and a second example stacked silicon dioxide/aluminum oxide layer having a thicker aluminum oxide layer than the first example (FIG. 5D).
Figure 5B:
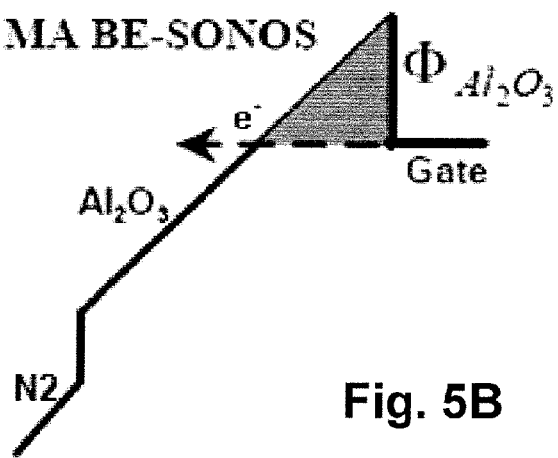
Figure 5C:
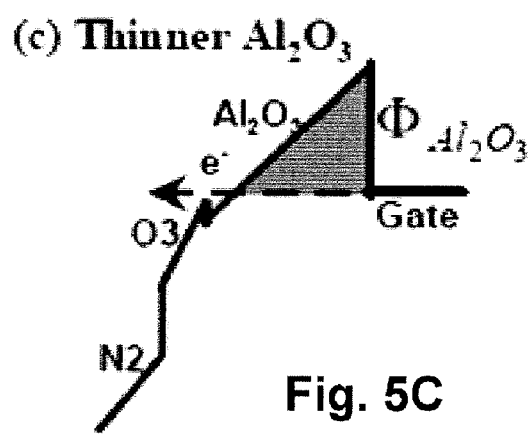
Figure 5D:
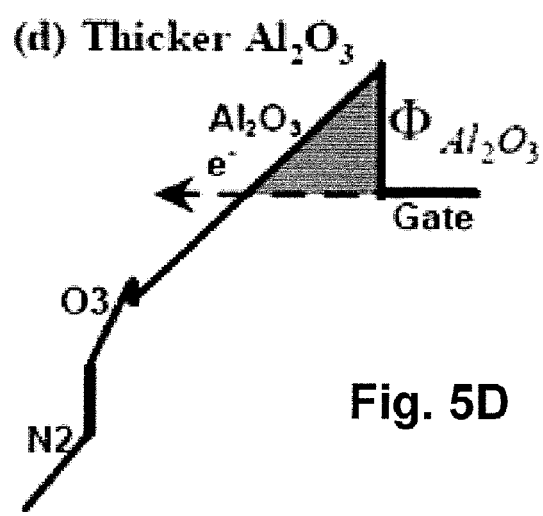

FIGS. 5A through 5D are conduction band diagrams for the blocking dielectric layer of a single silicon dioxide layer (FIG. 5A), a single aluminum oxide layer (FIG. 5B), a first example stacked silicon dioxide/aluminum oxide layer (FIG. 5C), and a second example stacked silicon dioxide/aluminum oxide layer having a thicker aluminum oxide layer than the first example (FIG. 5D). The tunneling probability for electron injection from the gate can be understood from these figures. The magnitude of the electric field within the material is reflected by the slope of the conduction band. Thus, the region corresponding to the silicon dioxide buffer layer labeled O3 in FIGS. 5C and 5D has a greater slope than the region corresponding to the aluminum oxide capping layer. The conduction band offset at the gate interface is reflected by the height of the step in the conduction band. For a bandgap engineered SONOS device as shown in FIG. 5A, the tunneling probability is relatively high, even though the conduction band offset is relatively large because of the high magnitude of the electric field. For an embodiment having an aluminum oxide blocking dielectric layer as represented in FIG. 5B, the tunneling probability is relatively low because of the lower slope on the conduction band caused by the relatively high dielectric constant (e.g. greater than 7), and because the conduction band offset remains relatively high (e.g. greater than 3 eV). FIGS. 5C and 5D suggest that the tunneling probability for gate injection is about the same for multilayer stacks having a silicon dioxide buffer layer and an aluminum oxide top layer, so long as the thickness of the aluminum oxide top layer is larger than a minimum value. Thus, the tunneling probability for the embodiment FIG. 5C having a thinner aluminum oxide layer is about the same as that for the embodiment of FIG. 5D having a thicker aluminum oxide layer.

Figure 6:
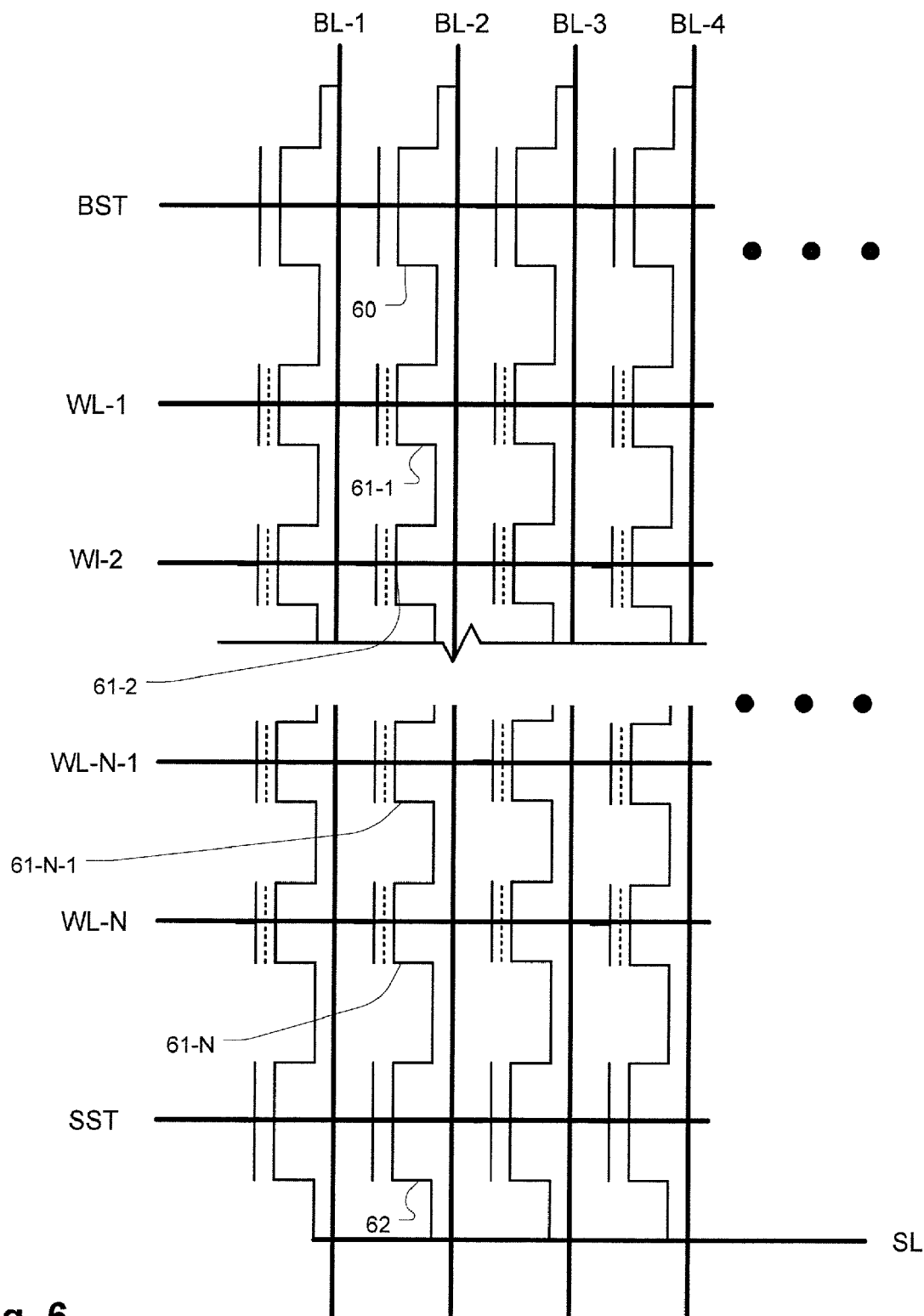
FIG. 6 is a schematic diagram of a NAND-type memory array employing memory cells according to the present invention.

Memory cells implemented as described above can be arranged in a NAND-type array as shown in FIG. 6. The array includes a plurality of bit lines BL-1, BL-2, BL-3, BL-4, . . . , and a plurality of word lines WL-1, WL-2, WL-N-1, WL-N. Groups of N memory cells are connected in series between a block select transistor coupled to a corresponding bit line and a source select transistor coupled to a source line. A block select word line BST is coupled to a row of block select transistors and a source select word line SST is coupled to a row of source line connect transistors. Thus, for example, for a representative bit line, BL-2, in the figure, a block select transistor 60 connects a series of memory cells 61-1 through 61-N to the bit line BL-2 in response to the signal BST on the block select word line. The last memory cell 61-N in the series is connected to source select transistor 62 which couples the series to the source line SL in response to the signal SST on a source select word line.

In the alternative, the memory cells can be arranged in AND-type, NOR-type and virtual ground-type arrays often applied in flash memory devices.

Programming may be accomplished in the NAND array by applying incremental stepped pulse programming ISPP or other processes for inducing Fowler Nordheim FN tunneling. ISPP involves applying a stepped programming voltage, starting at a gate bias of for example about plus 17 V, and incrementing the voltage for each programming step by about 0.2 V. Each pulse can have a constant pulse width of about 10 μs for example. In variations of the technique, the pulse width and the increment applied for each succeeding pulse can be varied to meet the needs of the particular implementation. The memory cells of this type have demonstrated relatively linear programming characteristics, and very large memory windows compared to the prior art, making them particularly well-suited to storing multiple bits per cell with multilevel programming technologies. In alternative embodiments, the so-called voltage pulse self-boosting technique is applied for programming. Other biasing arrangements can be applied as well, selected for compatibility with array characteristics.

Other programming bias techniques can be applied. For NOR array structures, various biasing arrangements for inducing hot electron tunneling or FN tunneling may be applied as well as other techniques known in the art.

Figure 7:
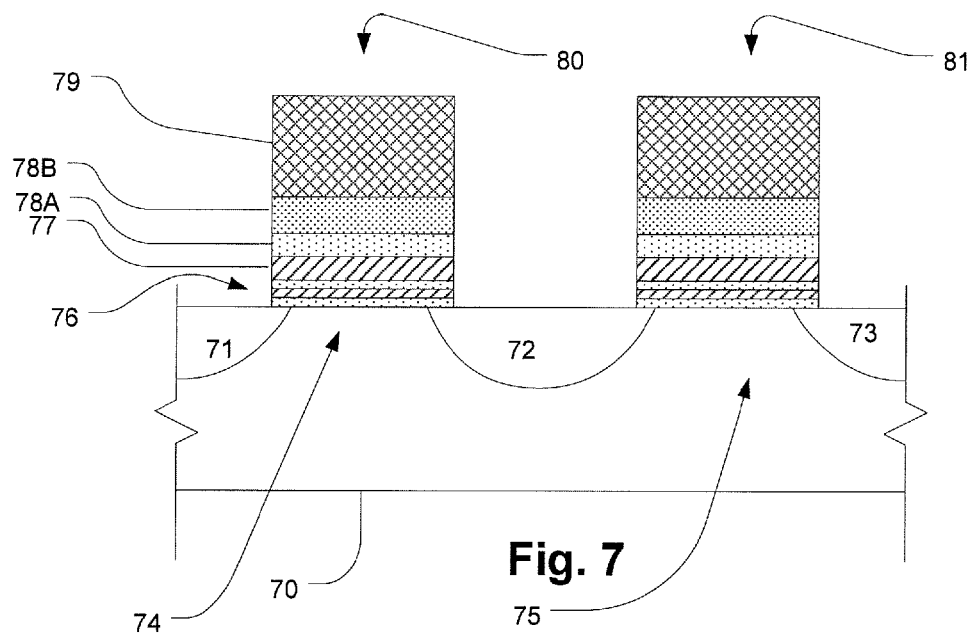
FIG. 7 is a simplified cross-sectional view of memory cells according to the present invention in a NAND configuration, taken perpendicular to word lines.
Figure 8:
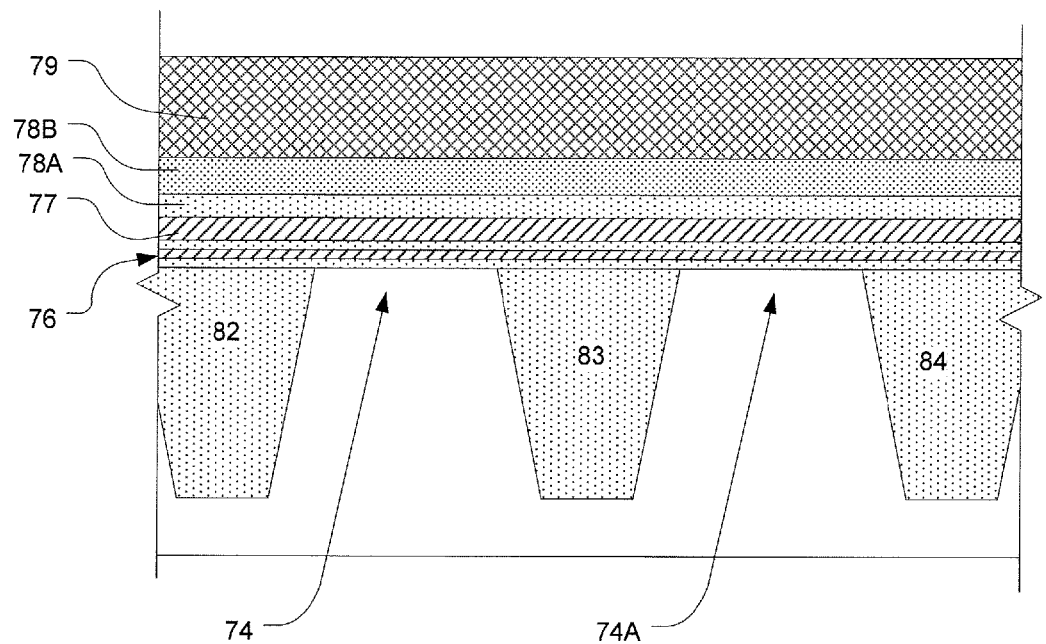
FIG. 8 is a simplified cross-sectional view of memory cells according to the present invention in a NAND configuration, taken through a word line.

FIGS. 7 and 8 show cross-sectional views of a representative memory cell structure as described herein implemented in a NAND-type array, taken across the word lines and along the word line respectively. FIG. 7 shows a semiconductor body 70 including channel regions 74, 75 and source/drain terminals 71, 72, 73 contacting the channel regions. The channel length between the source and drain terminals is preferably less than 50 nm, and in preferred embodiments 30 nm or less. The composite dielectric tunneling layer 76, the charge trapping layer 77, the multilayer blocking dielectric layer 78A/78B and the word line layer 79 are arranged in stacks 80 and 81 over the channel regions 74 and 75, respectively.

FIG. 8 shows the structure of FIG. 7 taken in cross-section along a word line which includes the same stack with the same reference numerals as described with reference to FIG.

7. Columns of series connected cells are separated by shallow trench isolation STI structures 82, 83, 84. In the illustration, the surfaces of the channel 74, and of the adjacent channel 74A, are planar. Implementations of the device may include recessed (concave) channel surfaces in this cross-section, or extended (convex) channel surfaces, depending on the manufacturing techniques and the desired product. The tunneling dielectric layer 76 and the rest of the stack, including layers 77, 78A/78B, 79 overlie the channel surfaces, whether planar, concave or convex, in a conformal manner. The channel width between the STI structures (e.g., 82, 83) is preferably less than 50 nm, and more preferably as small as the STI techniques allow.

Figure 9:
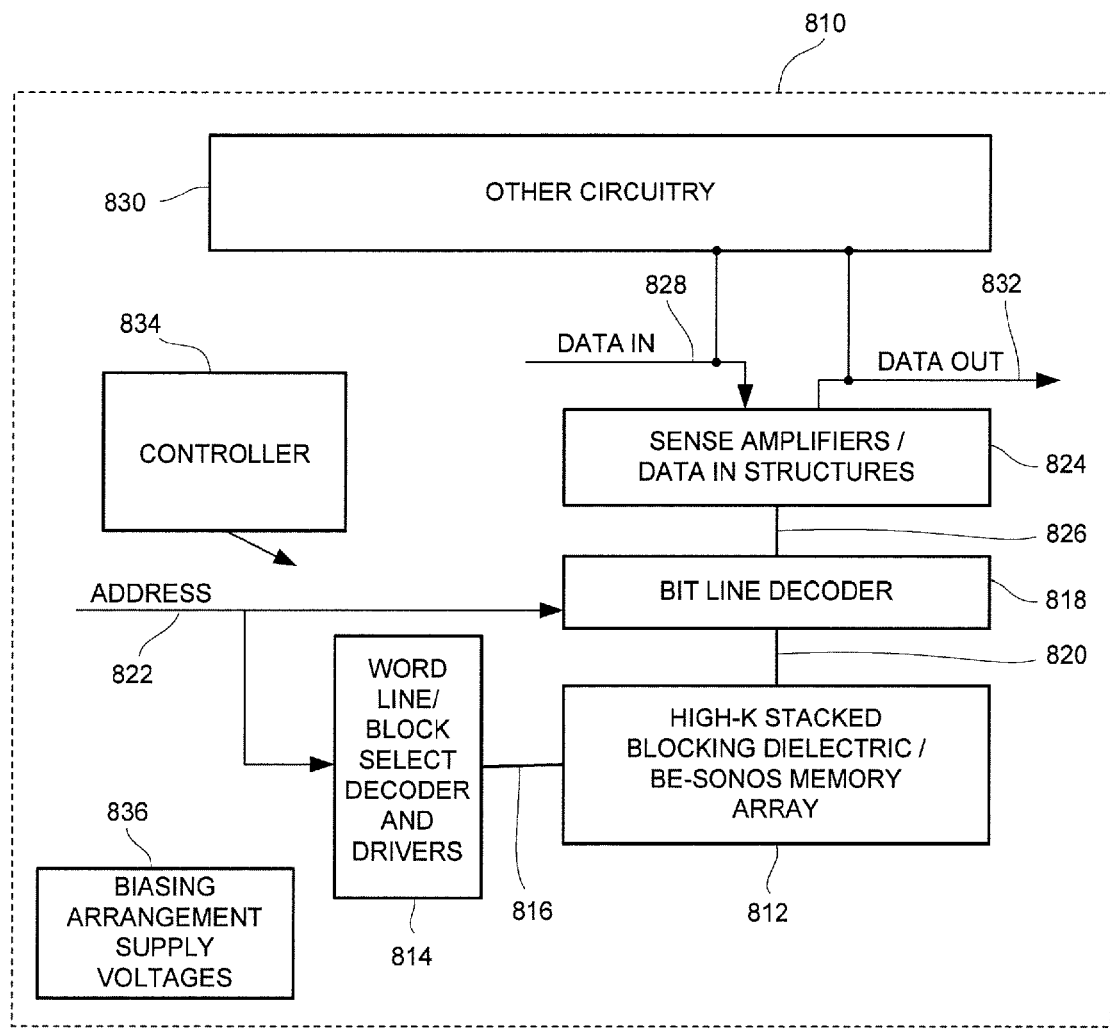
FIG. 9 is a block diagram of an integrated circuit memory employing memory cells and bias circuitry according to embodiments of the present invention.

FIG. 9 is a simplified block diagram of an integrated circuit employing blocking dielectric engineered BE-SONOS memory cells as described herein having a metal or polysilicon gate, a multilayer, high-κ capped blocking dielectric, and a bandgap engineered tunneling dielectric layer. The integrated circuit 810 includes a memory array 812 implemented using blocking dielectric engineered BE-SONOS memory cells as described herein on a semiconductor substrate. A word line (or row) and block select decoder 814 are coupled to, and in electrical communication with, a plurality 816 of word lines and block select lines, and arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Addresses are supplied on bus 822 to the word line decoder and drivers 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

The array 812 can be a NAND array, an AND array or a NOR array, depending on the particular application. The very large memory window available supports storing multiple bits per cell, and thus multiple bit sense amplifiers can be included on the device.

A controller implemented in this example, using bias arrangement state machine 834, controls the application of bias arrangement supply voltages and current sources 836, such as read, program, erase, erase verify, program verify voltages or currents for the word lines and bit lines, and controls the word line/source line operation using an access control process. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

Figure 10:
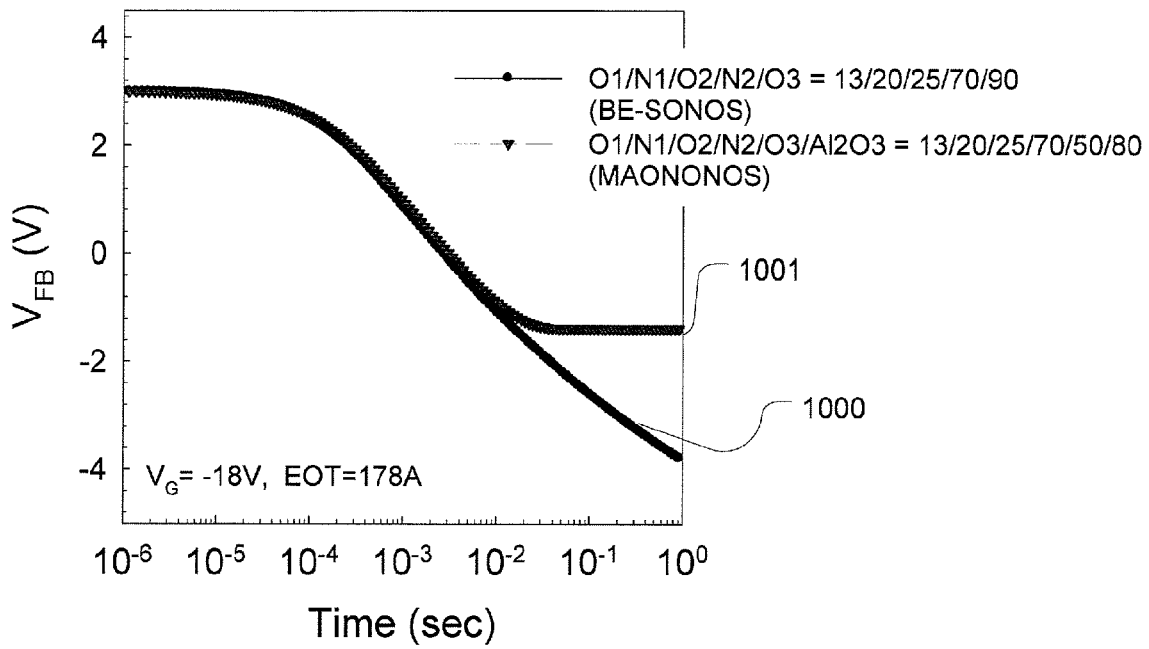
FIG. 10 is a graph of flat band voltage versus erase bias time showing erase curves for BE-SONOS cells with a single silicon dioxide layer blocking dielectric and with a multilayer blocking dielectric as described herein.

FIG. 10 is a graph of simulated flat band voltage (which correlates with threshold voltage for a memory cell) versus erase bias time showing simulated erase curves for a negative 18 V erase bias for an embodiment of a memory cell having a tunneling dielectric layer comprising a tunneling layer (O1) of 13 Å of silicon dioxide on the channel surface, an offset layer (N1) of 20 Å silicon nitride and an isolation layer (O2) of 25 Å silicon dioxide, a charge trapping layer (N2) comprising 70 Å of silicon nitride, a blocking dielectric (O3) consisting of silicon dioxide 90 Å thick, and in a similar cell in which the blocking dielectric includes a buffer layer (O3) of silicon dioxide about 50 Å thick capped by a layer of aluminum oxide about 80 Å thick so that the effective oxide thickness of both embodiments is about 178 Å. The channel is grounded in these examples, and the gate voltage $V_G$ is about −18 V. The plot shows on trace 1001 that the erase saturation occurs in the embodiment without the aluminum oxide cap layer at a flat band voltage level higher than negative 2 V. However, the plot shows on trace 1000 that with the aluminum oxide capping layer, erase saturation is avoided at least to flat band voltage levels below −4 V.

Figure 11:
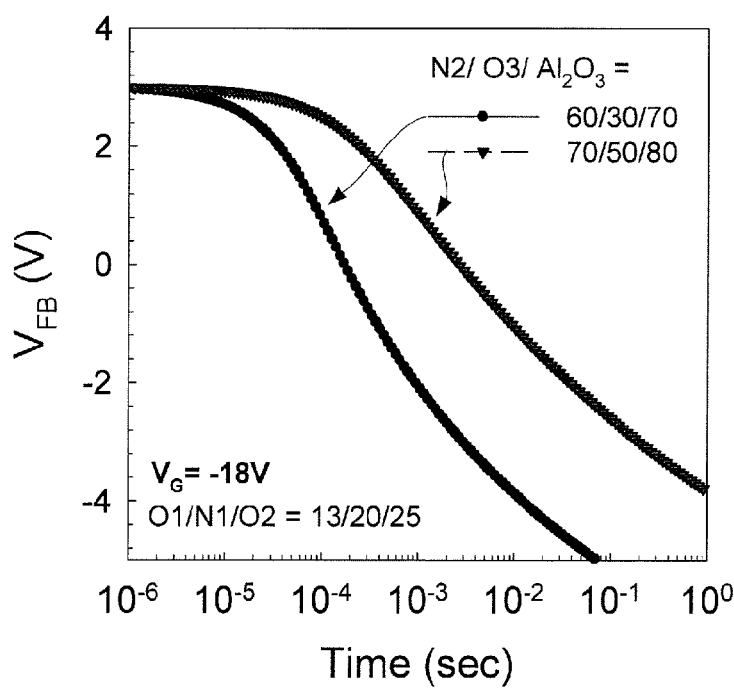
FIG. 11 is a graph of flat band voltage versus erase bias time showing erase curves for different multilayer blocking dielectric structures.

FIG. 11 is a graph of simulated flat band voltage versus erase bias time for similar cells with varying thicknesses of the charge trapping layer N2. The thickness of the silicon oxide buffer layer O3 and the thickness of the aluminum oxide capping layer are adjusted. The embodiment in which the charge trapping layer is 60 Angstroms, the buffer layer is 30 Angstroms and the capping layer is 70 Angstroms has a much higher erase speed than the alternative embodiment in which the charge trapping layer is 70 Angstroms, the oxide buffer is 50 Angstroms and the aluminum oxide capping layer is 80 Angstroms. This erase speed characteristic can be explained by the smaller effective oxide thickness of the first example, resulting in greater magnitude of electric field across the tunneling layer. However, in the embodiment in which the charge trapping layer is 60 Angstroms, the buffer layer O3 is less than $\kappa_2/\kappa_1$ times the capping layer. Thus, such cell will suffer reduced charge retention.

Figure 12:
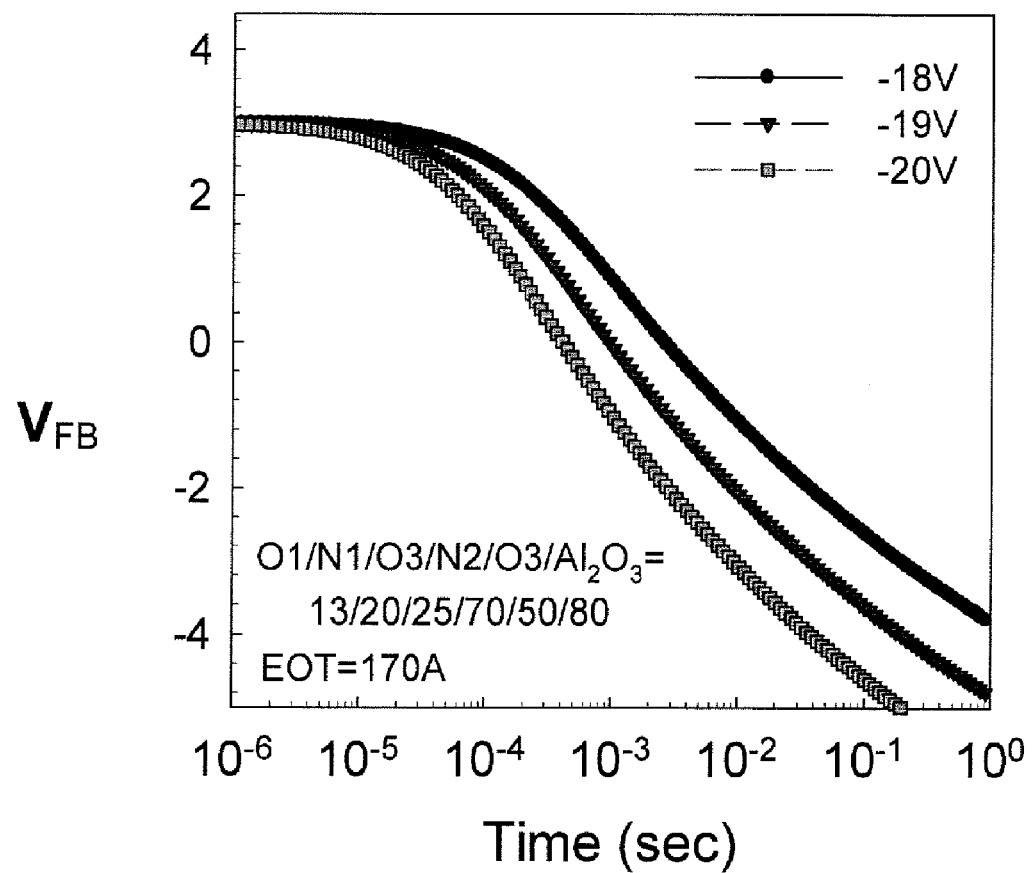
FIG. 12 is a graph of flat band voltage versus erase bias time showing erase curves for different erase bias voltages in a BE-SONOS cell with a multilayer blocking dielectric as described herein.

FIG. 12 is a graph of simulated flat band voltage versus erase bias time for a memory cell embodiment with a buffer layer of silicon dioxide about 50 Angstroms thick and a capping layer of aluminum oxide about 80 Angstroms thick, with various erase bias voltages. As illustrated, the erase speed improves significantly with increasing erase bias from −18 V to about −20 V. At erase bias of about −20 V, a threshold reduction of more than 7 V can be accomplished in about 100 ms. More than 2 V reduction in threshold can be accomplished in less than 1 ms.

Figure 13:
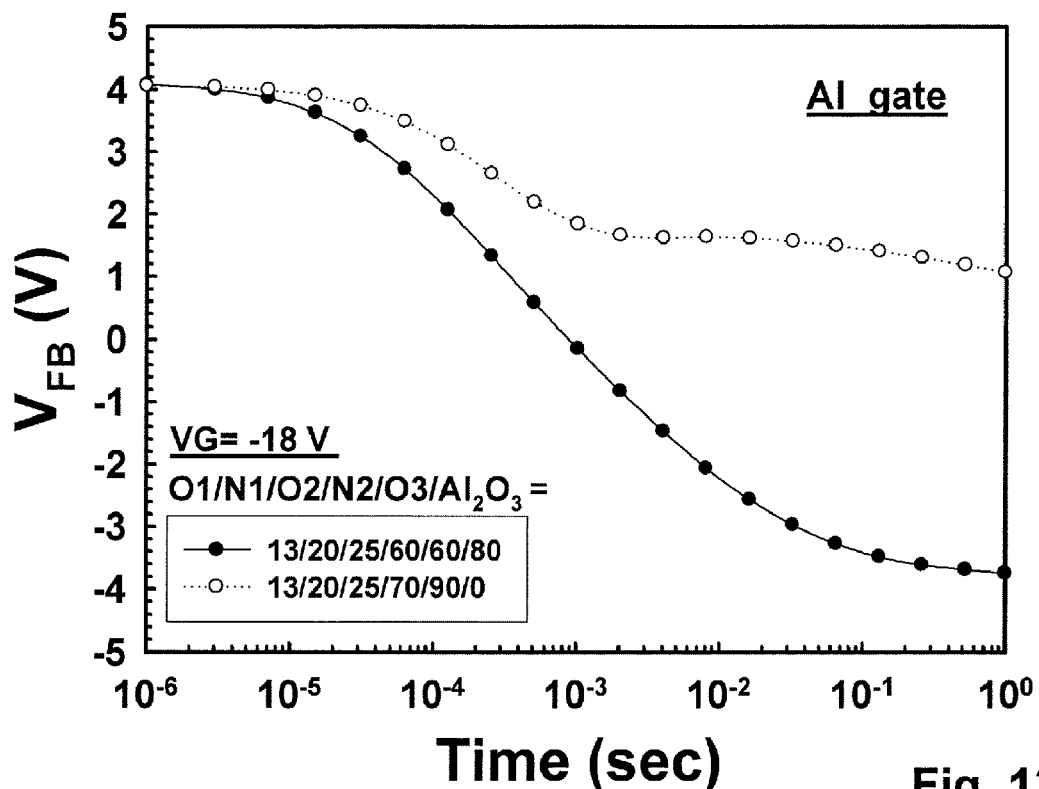
FIG. 13 is a graph of flat band voltage versus erase bias time showing erase curves for BE-SONOS cells having an aluminum gate, with a single silicon dioxide layer blocking dielectric and with a multilayer blocking dielectric as described herein.

FIG. 13 illustrates performance of a memory cell embodiment with and without the capping layer in the blocking dielectric, having an aluminum gate. An aluminum gate has a relatively low work function. However it can be seen as the use of the capping dielectric layer lowers the erase saturation threshold to a flat band voltage of almost negative 4 volts. In contrast, in an embodiment with a single silicon dioxide blocking layer, the erase saturation occurs at above positive 1 V.

Figure 14:
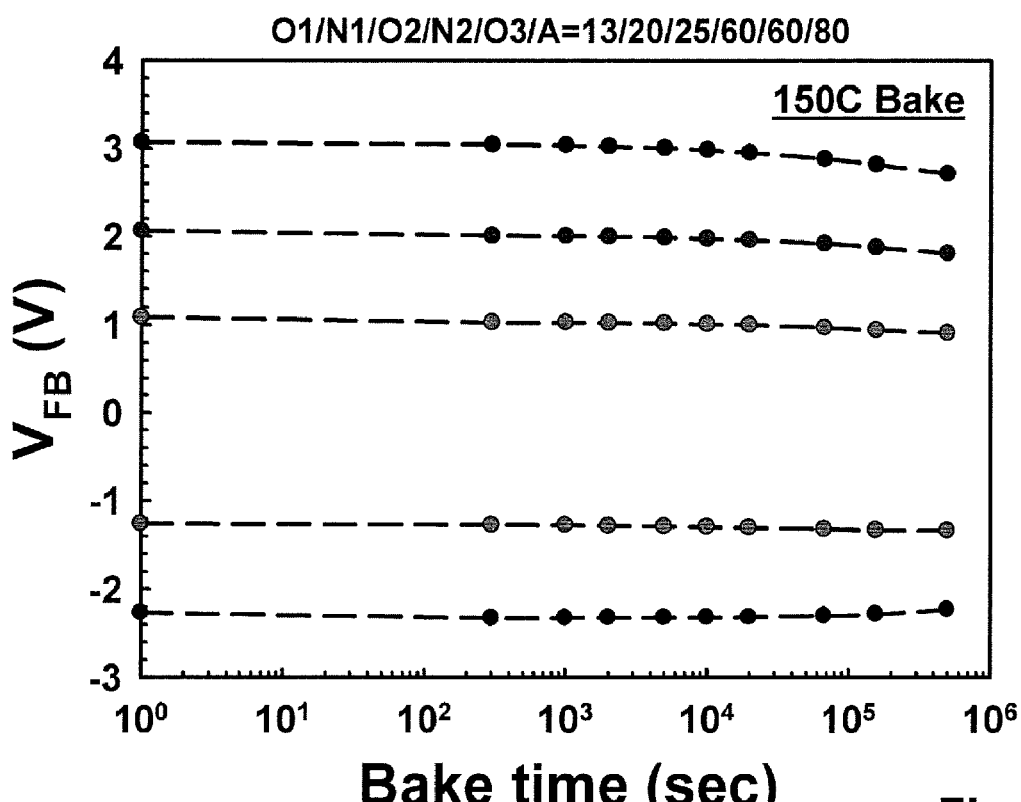
FIG. 14 is a graph of flat band voltage versus baking time showing excellent charge retention for various threshold levels for BE-SONOS cells with a multilayer blocking dielectric as described herein.

FIG. 14 shows retention characteristics according to a bake test for an embodiment of the memory cell described herein with a 60 Angstrom silicon dioxide buffer layer and an 80 Angstrom aluminum oxide capping layer. As can be seen, for flat band voltage thresholds of about 3, 2, 1, −1 and −2 volts, charge retention is quite good for baking times out to a million seconds at 150° C.

Figure 15B:
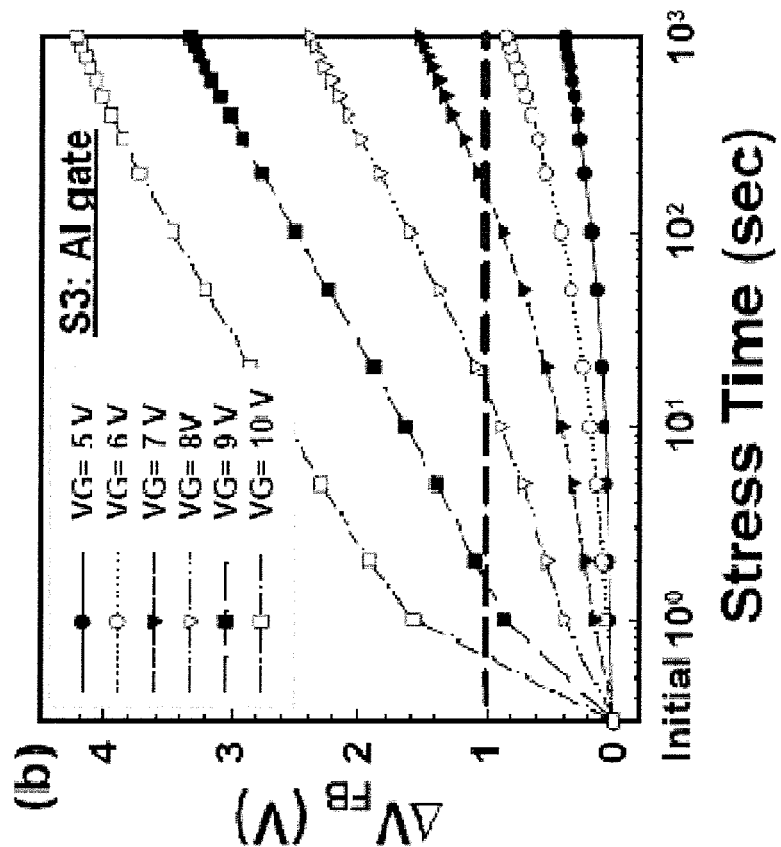
FIGS. 15A-15B are graphs of change in flat band voltage versus stress time, for BE-SONOS cells with a multilayer blocking dielectric as described herein, and with a single aluminum oxide layer blocking dielectric, respectively, for various read voltage levels.
Figure 15A:
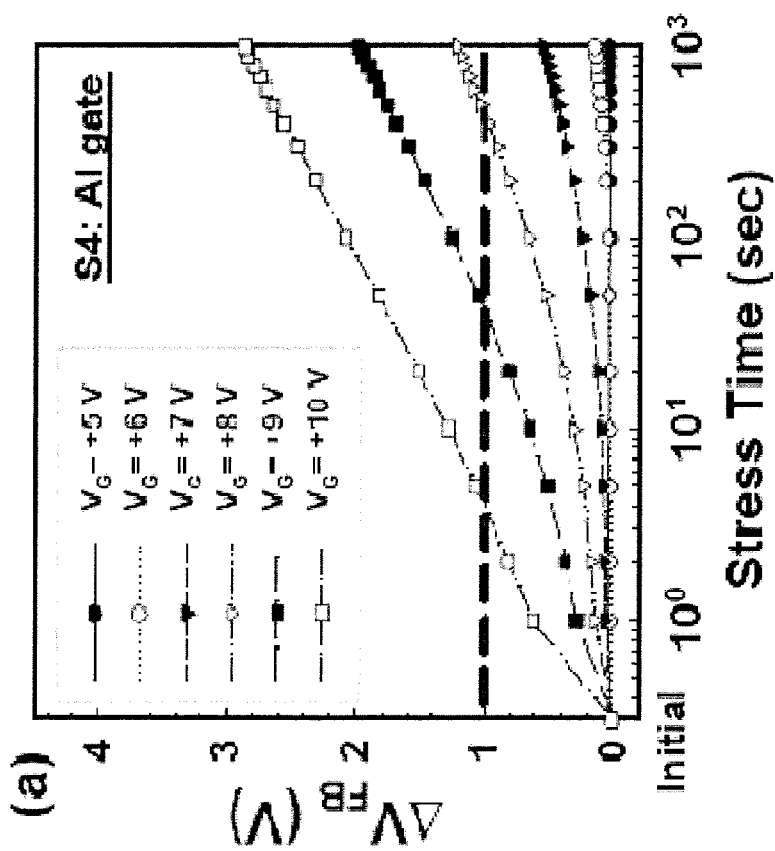

FIGS. 15A and 15B illustrate the read-disturb characteristics for various read voltages (e.g. word line voltage in a NAND configuration during a read operation) in a memory cell embodiment having a 60 Angstrom silicon dioxide buffer layer and a 65 Angstrom aluminum oxide capping layer, and a memory cell embodiment with a 150 Angstrom aluminum oxide blocking layer, without a silicon dioxide buffer layer, respectively. Both embodiments have an aluminum gate, with a relatively small work function. As shown in FIG. 15A, the read voltage can exceed about 7.6 V and still pass one million read cycles without disturbing the threshold voltage of the cell by more than 1V. On the other hand, without the silicon dioxide buffer layer, maximum read voltage to pass this test is closer to 6 V.

Figure 16:
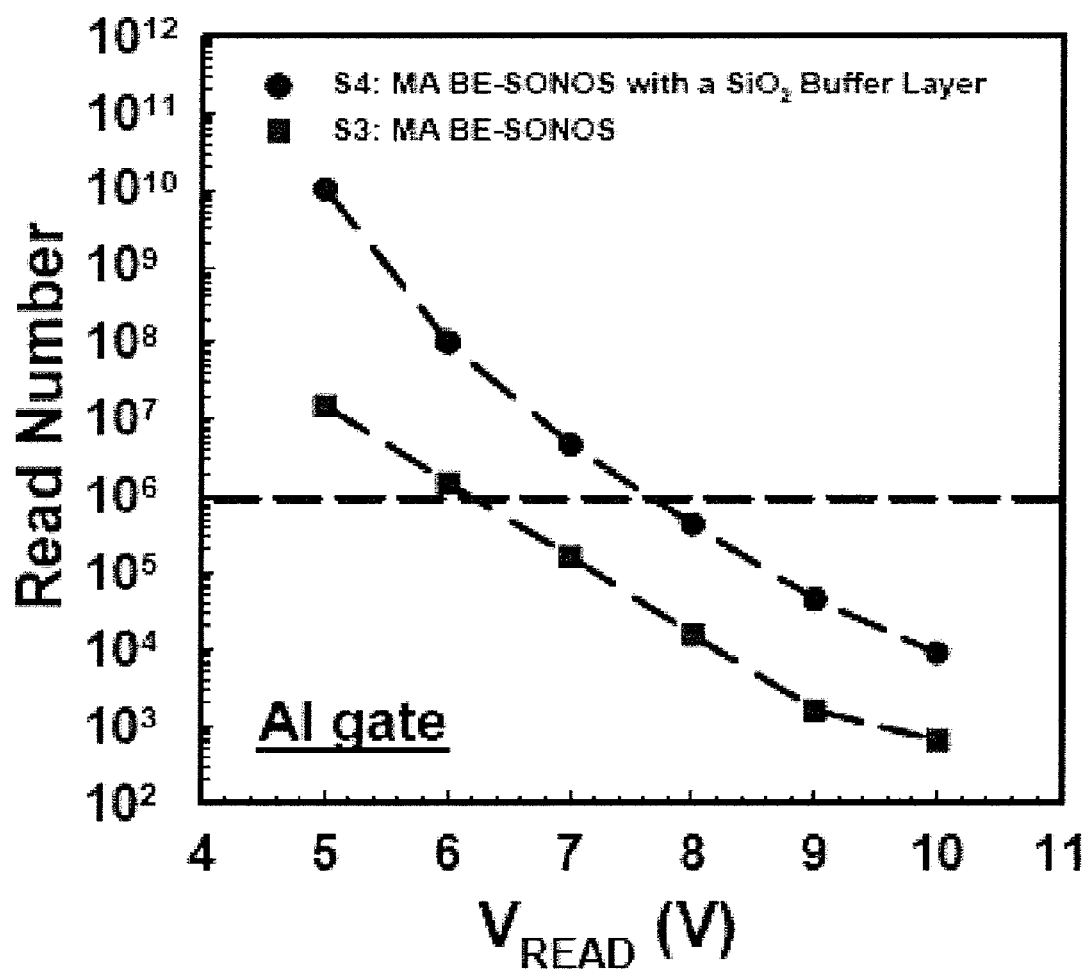
FIG. 16 is a graph of read cycle number versus read voltage for BE-SONOS cells with a multilayer blocking dielectric as described herein, and with a single aluminum oxide layer blocking dielectric.

FIG. 16 is a graph of read cycle number versus read voltage within a MA-BE-SONOS embodiment having an aluminum oxide blocking layer 150 Angstroms thick and a stacked 60 Angstrom silicon dioxide buffer/65 Angstrom aluminum oxide capping layer structure. For a read bias which passes the one million cycle test, it is predicted by this test that the use of the silicon dioxide buffer layer will improve the endurance by more than two orders of magnitude.

Figure 17:
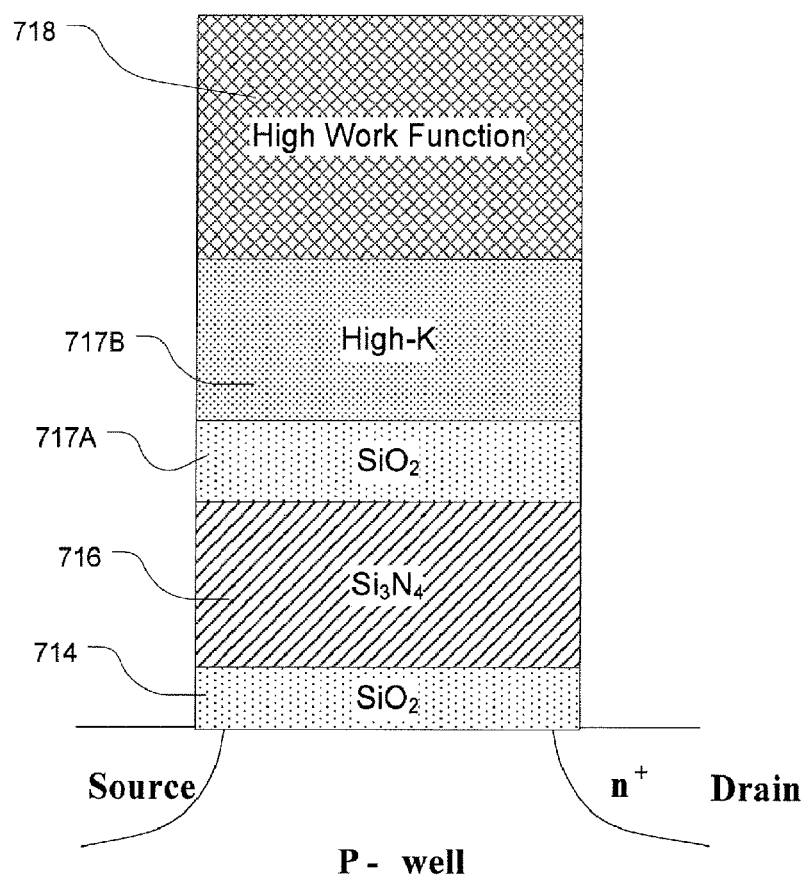
FIG. 17 is a simplified cross-section of a MONOS style memory cell with a high-κ capping layer.

FIG. 17 shows a memory cell comprising a MONOS multi-layer stack with a high-κ capping layer 717B, without the bandgap engineered tunneling layer of FIG. 1. Referring to FIG. 17, the "High Work Function" gate 718 can comprise any metal gate material or alternatively a polysilicon gate. The high-κ capping layer can well suppress the gate injection so that almost all the metal films can be used, including materials like aluminum in which the work function is as low as 4.3 eV. TaN, TiN, P+ poly-Si gate and N+ poly gate may be preferred. Platinum is also a good metal gate material. Alternatives include Ti, Ta, Al, W, WN, $RuO_2$, etc.

The capping layer 717B is a high dielectric constant layer with the dielectric constant >6, such as $Al_2O_3$, $HfO_2$, $ZrO_2$, $La_2O_3$, AlSiO, HfSiO and ZrSiO etc., where $Al_2O_3$ and $HfO_2$ are preferred in this invention. The thickness of high-κ top-capping layer is 3~20 nm. The buffer layer 717A can be wet conversion $SiO_2$ from nitride, high temperature oxide (HTO) or LPCVD $SiO_2$ etc. However, the wet conversion $SiO_2$ is preferred. The preferred thickness of buffer layer 717A is 0.5~8 nm, where the relative thickness satisfies the relation that is more than κ1/κ2 time the thickness of the capping layer 717B.

For embodiments employing a buffer layer of silicon dioxide and a capping layer of aluminum oxide, the thickness range for $SiO_2$ buffer layer is preferably in the range of 20~70 Å, and the $Al_2O_3$ capping layer preferably has a thickness less than 50 Å. Currently preferred embodiments use a $SiO_2$ buffer layer of about 60 Å, and a capping layer of $Al_2O_3$ of about 40 Å.

The charge trapping layer 716 is preferably silicon nitride, which offers a high trap density. Other materials, including for example silicon oxynitride, silicon rich nitride, and silicon rich oxide, can be used as charge trapping layers.

The tunnel layer 714 is grown on top of silicon channel with a thickness range from 3~5 nm. Furnace oxide where the tunnel oxide is formed by oxidation of the silicon substrate, is preferred in this embodiment.

Figure 18:
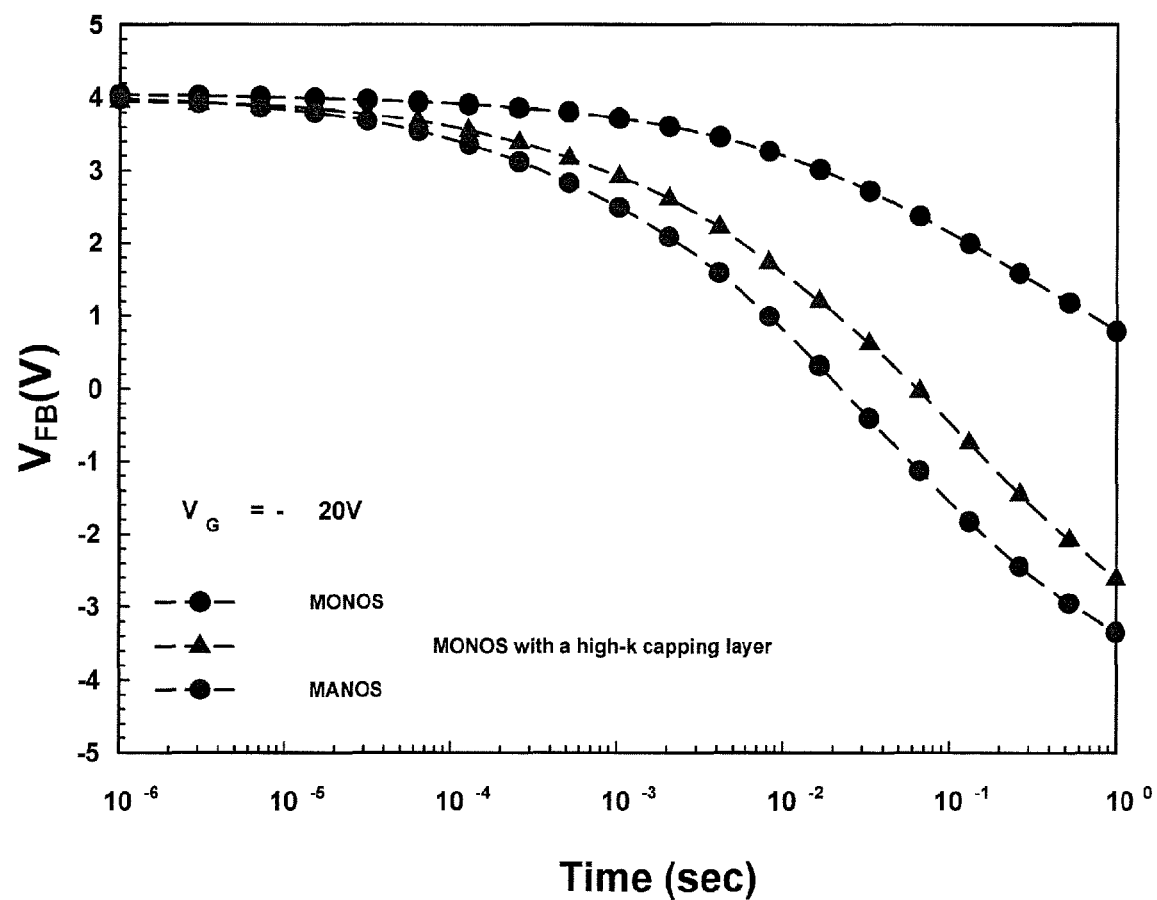
FIG. 18 shows erase characteristics of MONOS, MONOS with a high-κ capping layer and MANOS.

FIG. 18 shows the erase characteristics of typical MONOS, MONOS with a high-κ capping layer as described herein, and MANOS. The dimensions of the cell are shown in the table below. Platinum is the gate material for the cells in the simulation. MANOS and MONOS with a high-κ capping layer have lower erase saturation levels and larger memory windows than MONOS. In addition, MANOS and MONOS with a high-κ capping layer also have higher erase speed.

| | Tunneling dielectric | Trapping Nitride (N2) | Top Dielectric | EOT |
|---|---|---|---|---|
| MONOS | 45 | 70 | $SiO_2$ = 90 | 174 |
| MONOS with a high-k capping layer | 45 | 70 | $SiO_2/Al_2O_3$ = 40/60 | 155 |
| MANOS | 45 | 70 | $Al_2O_3$ = 150 | 162 |

* The unit is angstrom.

Compared with conventional single $SiO_2$ layer for blocking oxide, the high-κ capping layer has higher dielectric constant and can well suppress the gate electron injection, therefore, high-κ capping layer is also good for the EOT scaling of blocking oxide.

Figure 19:
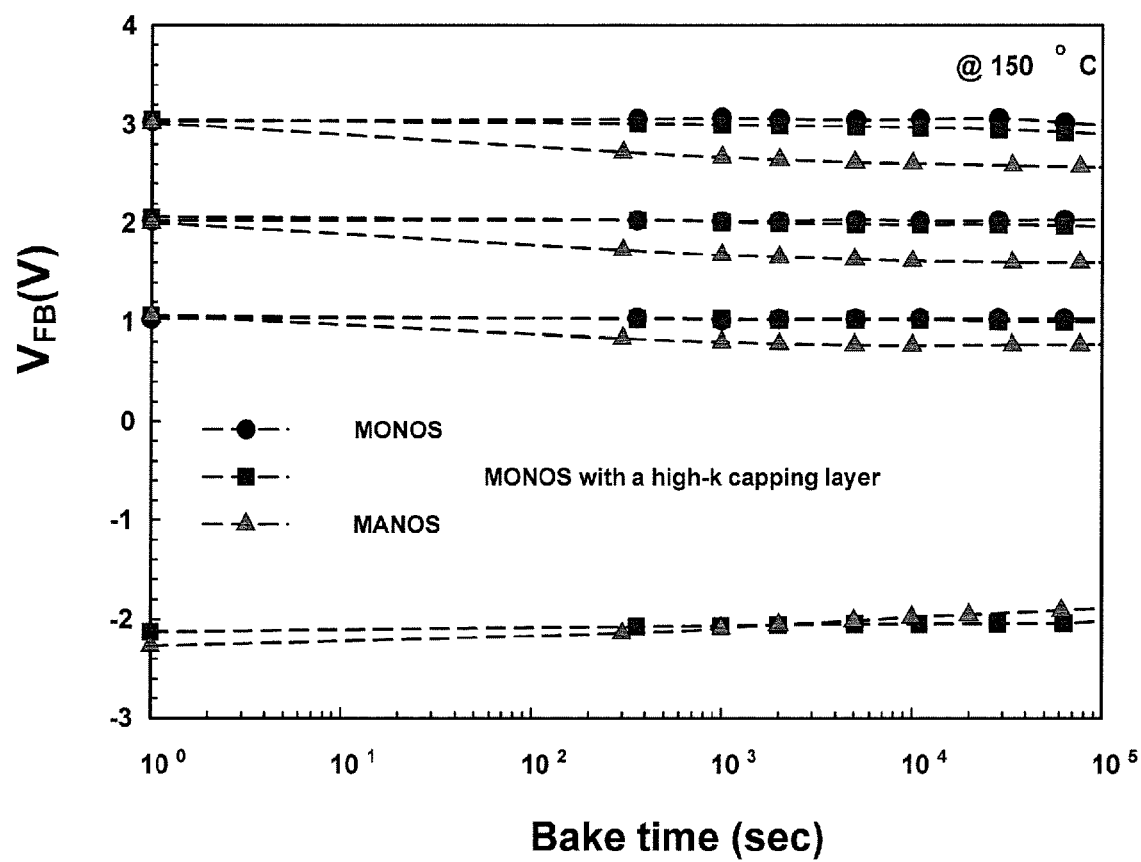
FIG. 19 shows retention characteristics of MONOS, MONOS with a high-κ capping layer and MANOS.

FIG. 19 shows the retention characteristics of MONOS, MONOS with a high-κ capping layer and MANOS, where MONOS and MONOS with a high-κ capping layer have better retention than MANOS. It's because the unstable high-κ/SiN interface is eliminated by top oxide ($SiO_2$).

Figure 20:
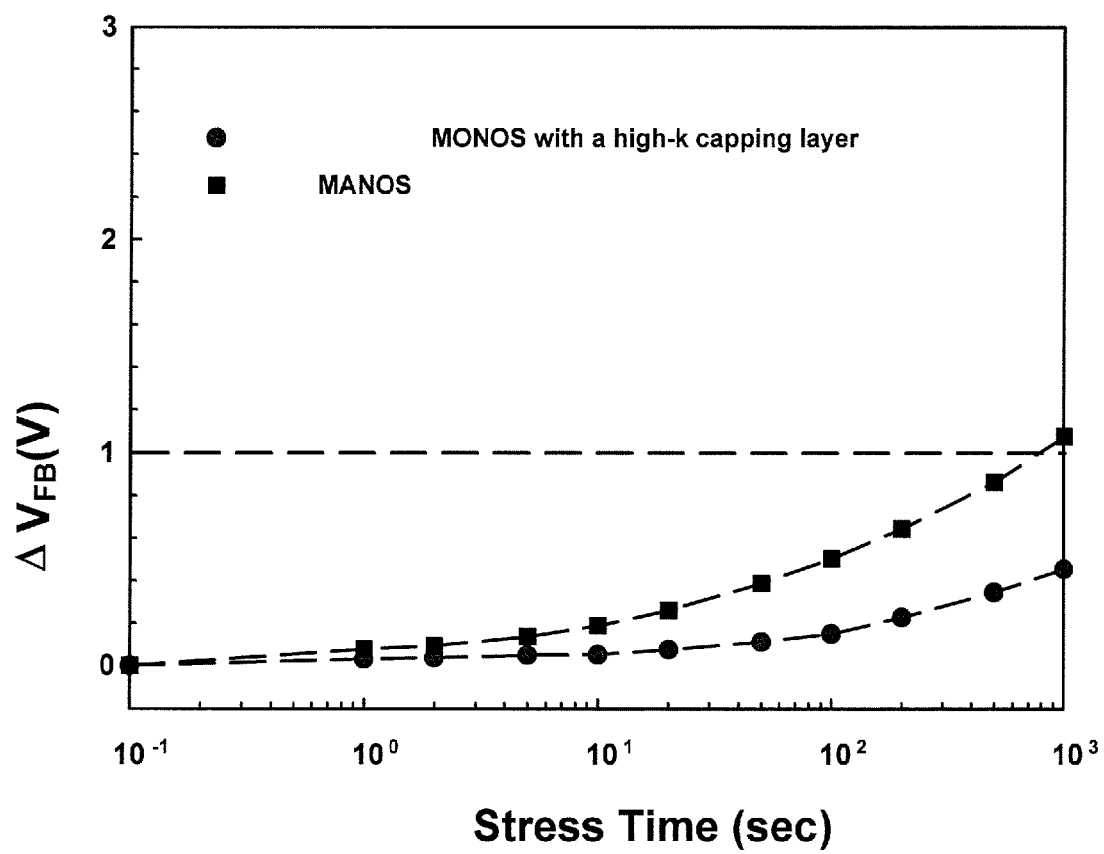
FIG. 20 shows read-disturb characteristics of MONOS, MONOS with a high-κ capping layer and MANOS.

FIG. 20 shows the read-disturb characteristics of MANOS and MONOS with a high-κ capping layer, where MONOS with a high-κ capping layer also shows a better performance because of the elimination of high-κ/SiN unstable interface.

In summary, MONOS with a high-κ capping layer has the most optimized performance among the three embodiments shown in the table above, such as low erase saturation level, large memory window, good retention and good immunity to read disturbance.

The examples described above are implemented using n-channel devices, in which the source and drain terminals are doped with n-type impurities. The technology can be implemented using p-channel devices as well, in which the source and drain terminals are doped with p-type impurities.

The examples described above are implemented using devices with flat or planar channel surfaces. The technology can be implemented using non-planar structures, including cylindrical channel surfaces, fin shaped channels, recessed channels and so on.

In the examples described above the charge storage stack is implemented so that the tunneling layer is on the channel surface and the blocking dielectric layer is adjacent the gate. In alternatives, the charge storage stack may be reversed, so that the tunneling layer is adjacent the gate terminal and the blocking dielectric is on the channel surface.

A memory cell and memory architecture is provided using a composite multilayer blocking dielectric layer that includes a buffer layer and a capping layer of high dielectric constant material. The composite structure eliminates the unstable interface between high dielectric constant materials and the charge trapping layer. Experimental results show that the device suppresses erase saturation and provides excellent data retention. A very large memory window (greater than 7V) with excellent cycling endurance, read disturb immunity and data retention has been demonstrated. Memory cells having gate lengths on the order of 45 nm or less can be provided.

Figure 21:
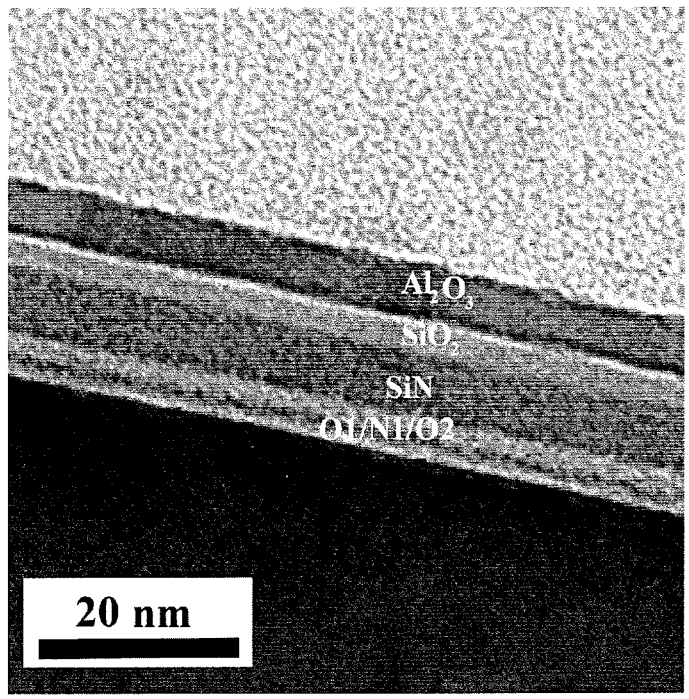
FIG. 21 shows TEM micrograph of MA BE-SONOS with a $SiO_2$ buffer layer.

Experimental results have been obtained based on fabrication of MA BE-SONOS basically similar to [S. C. Lai et al, IEEE NVSMW, pp. 88-89, 2007]. Before $Al_2O_3$ deposition, various oxide buffer layers converted from part of nitride are formed by furnace wet oxidation. The typical TEM cross-sectional view of the device is shown in FIG. 21. MANOS with a $SiO_2$ buffer layer is also fabricated for comparison in this study.

Figure 22:
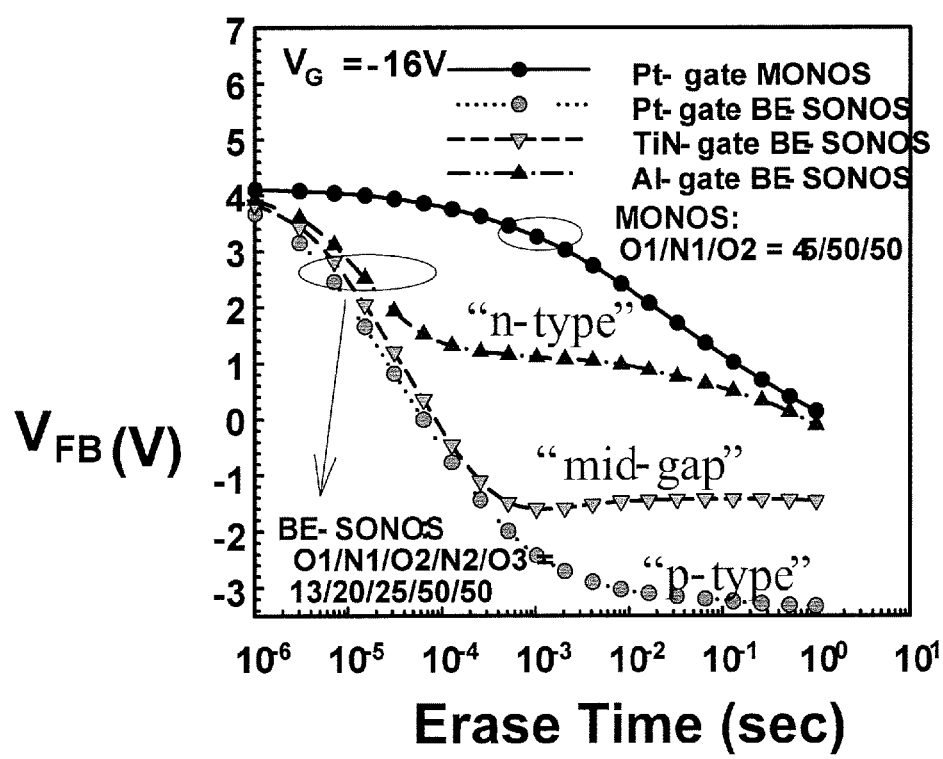
FIG. 22 shows erase characteristics of MONOS, and BE-SONOS with different gate materials. Al (n-type), TiN (mid-gap) and Pt (P-type) gate are compared. BE-SONOS has much faster erase speed than MONOS (EOT ~130 Å for both devices). For BE-SONOS, higher work-function metal gate has lower erase saturation.

FIG. 22 shows that the erase speed of BE-SONOS is much faster than MONOS at the same EOT. This is because ONO tunneling barrier in BE-SONOS greatly enhances the channel hole tunneling efficiency for the erase, while electron de-trapping in MONOS is very slow. On the other hand, the gate material has profound effect on the erase saturation. A high work-function metal gate (such as Pt) is necessary to suppress the gate injection for these type cells.

Figure 23:
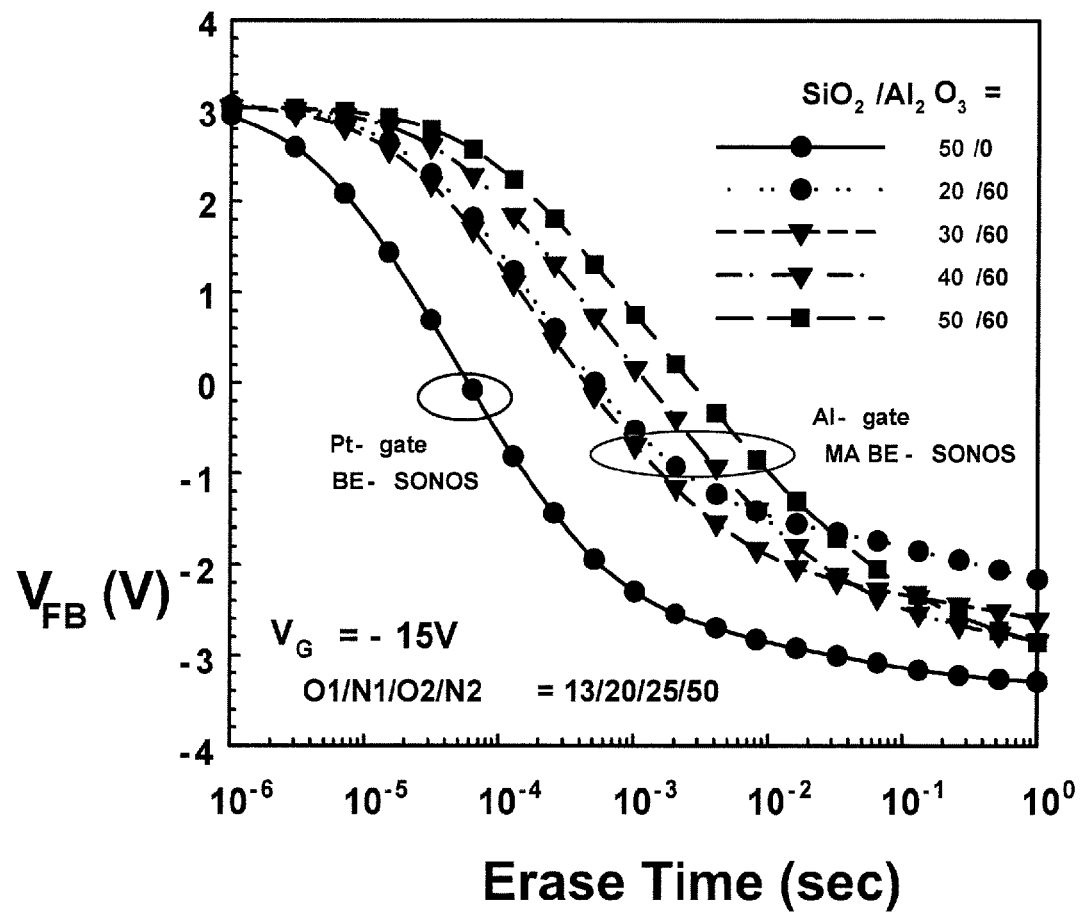
FIG. 23 shows erase characteristics of Pt-gate BE-SONOS and Al-gate MA BE-SONOS with various $SiO_2$ buffer layer at $V_G=-15$ V. Al-gate MA BE-SONOS shows similarly low erase saturation level just like Pt-gate BE-SONOS. This indicates that $Al_2O_3$ top-capping layer can greatly suppress the gate injection.

In order to suppress the gate injection, an additional $Al_2O_3$ layer is formed on top of BE-SONOS. FIG. 23 compares the erase characteristics of MA BE-SONOS with various $SiO_2$ buffer layers. It shows that MA BE-SONOS has a low erase saturation level, just like Pt-gate BE-SONOS, even using an "n-type" (low work function) Al gate. It can be expected that the erase saturation can be further improved when combined with a higher work function metal gate.

Figure 24:
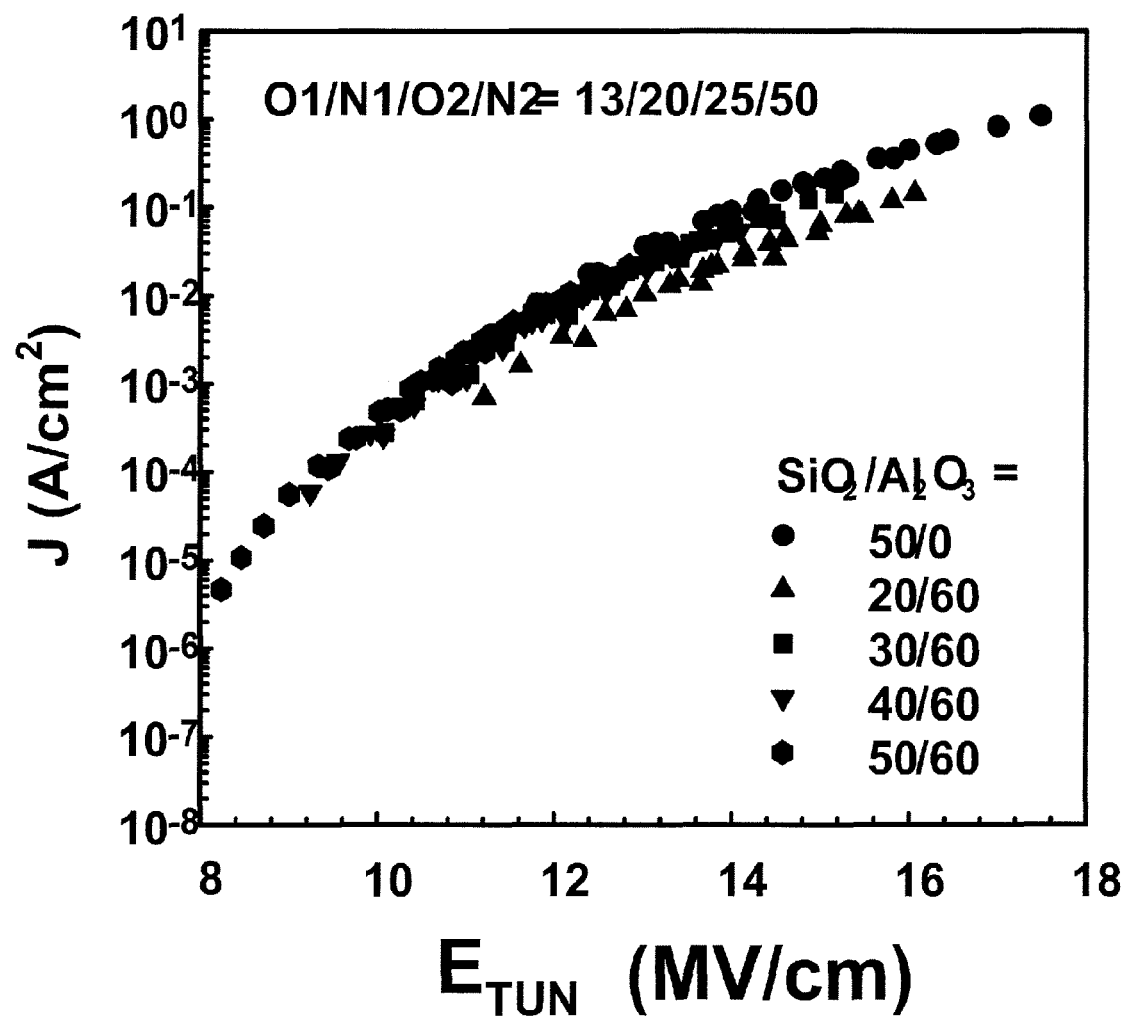
FIG. 24 shows erase transient current density in FIG. 23. All the samples show identical erase J-E curves. This implies that all the devices have the same erase mechanism, since they share the same ONO tunneling barrier.

In FIG. 23, the "apparently" lower erase speed of MA BE-SONOS with a $SiO_2$ buffer layer is attributed to the higher EOT. In order to fairly compare the erase speed, we employ the transient analysis [H. T. Lue et al, IEEE Electron Device Letters, vol. 25, pp. 816-818, 2004], as shown in FIG. 24. The J-E plot clearly shows that all the devices have the same erase current densities, since they share the same ONO tunneling barrier. This proves that the oxide buffer layer has no impact on the erase mechanism.

Figure 25:
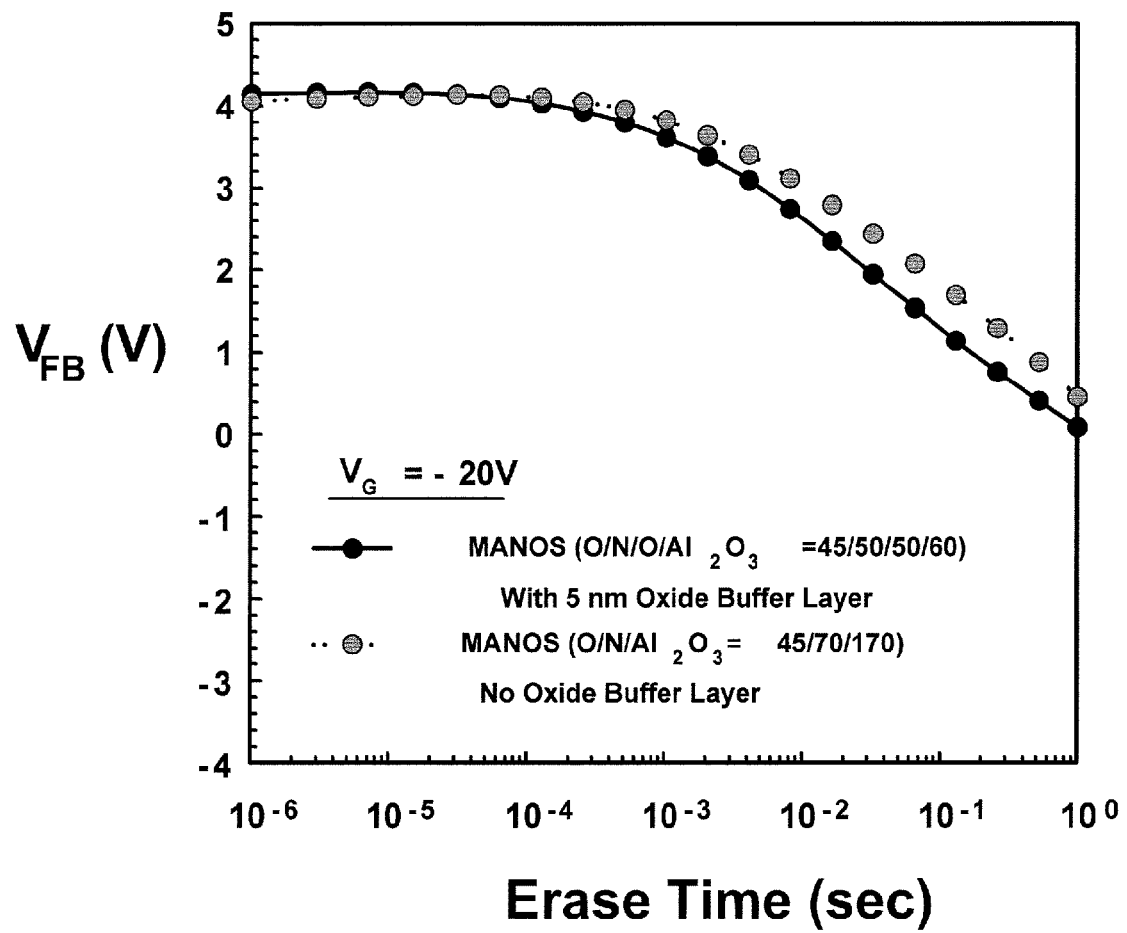
FIG. 25 shows erase speed comparison of MANOS with and without oxide buffer layer. The EOTs of MANOS with and without an $SiO_2$ buffer layer are 15.4 nm and 17.2 nm, respectively. The gate material is aluminum for both devices.

We also study the MANOS with an additional oxide buffer layer. FIG. 25 shows that the insertion of oxide buffer layer basically shows similar erase performance to MANOS. However, MANOS shows much slower erase speed than BE-SONOS, because electron de-trapping is very slow as compared with substrate hole injection. Therefore, MANO is less practical in terms of the erase speed.

Figure 26:
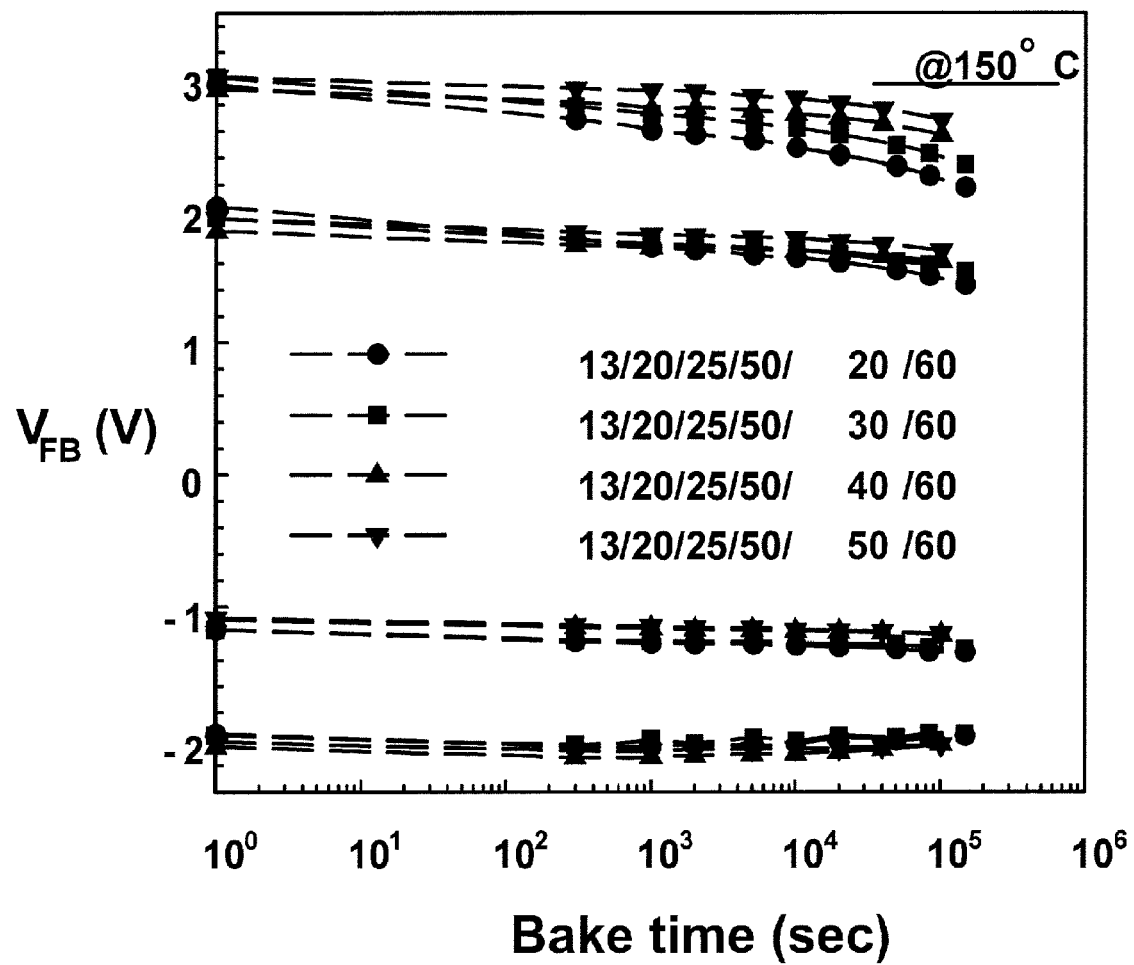
FIG. 26 shows 150° C. bake retention characteristics of MA BE-SONOS with various oxide buffer layer. Thicker oxide buffer layer improves the data retention.
Figure 27:
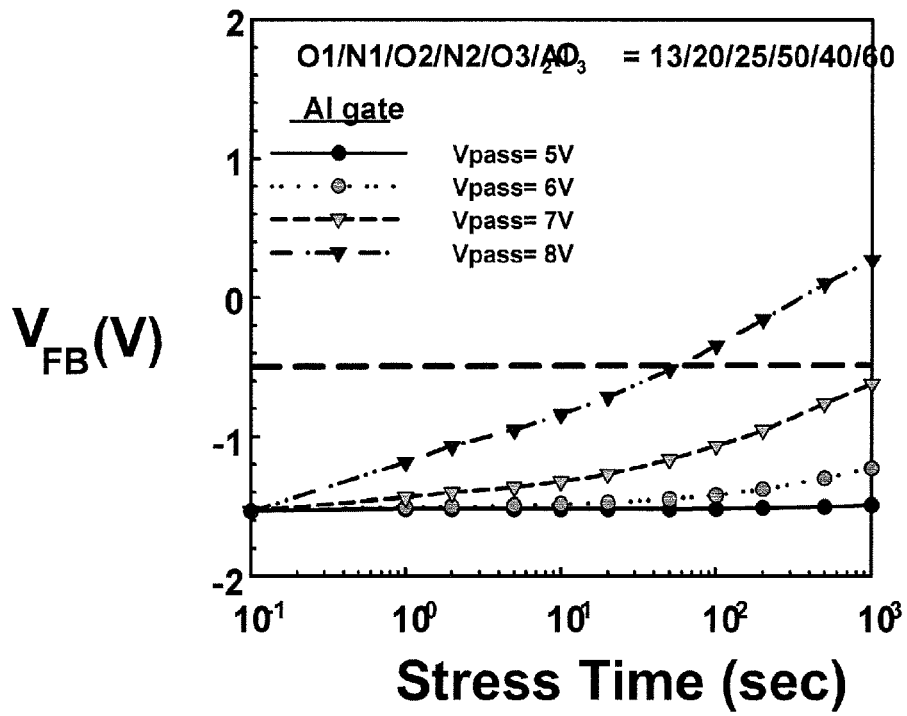
FIG. 27 shows read disturb test of MA BE-SONOS (13/20/25/50/40/60) with oxide buffer layer. Various gate voltage is applied to the erased state ($V_{FB}=-1.5$ V).
Figure 28:
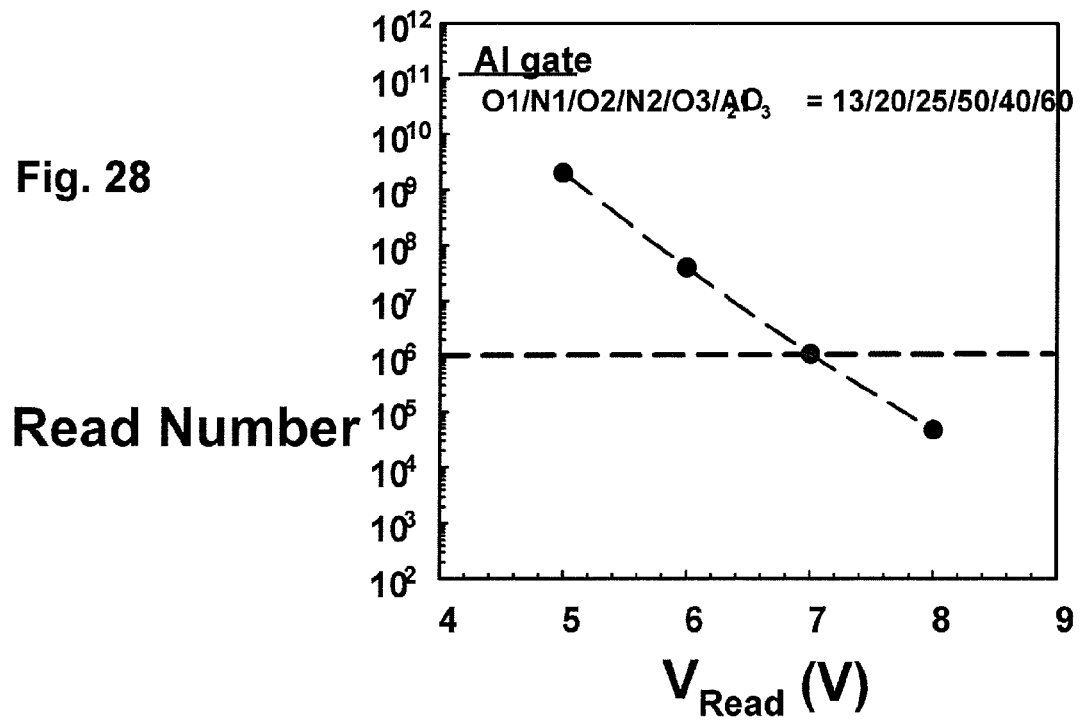
FIG. 28 shows read number vs. V-read curve of MA BE-SONOS with a 4 nm $SiO_2$ buffer layer, extracted from FIG. 27. The read number=(Stress time for $\Delta V_{FB}=1V$ at initial $V_{FB}=-1.5V$)/(1 ms read access time). The read number can exceed 1 M read cycles at Vread<7 V.
Figure 29:
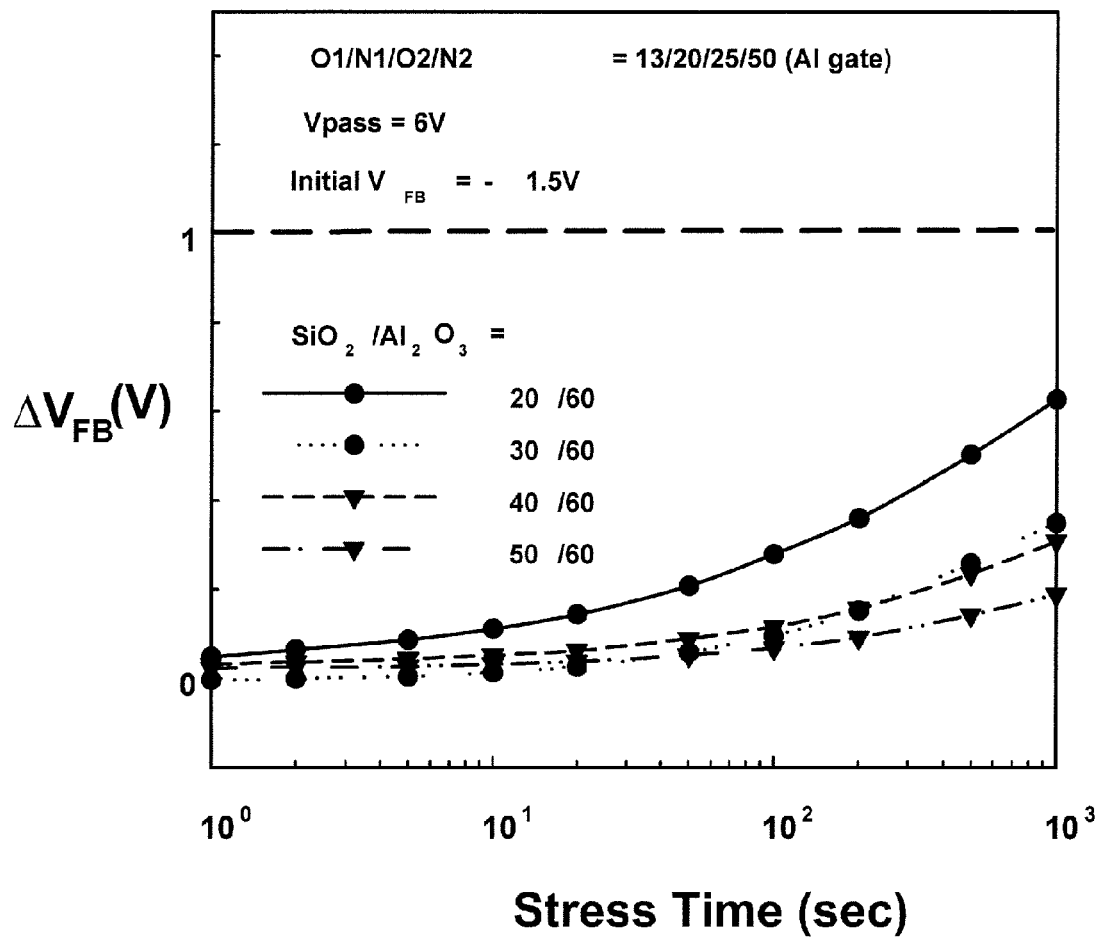
FIG. 29 shows read disturb characteristics of MA BE-SONOS with different thickness of $SiO_2$ buffer layer. Thinner oxide buffer layer shows slightly enhanced read disturb.

FIG. 26 compares the retention of MA BE-SONOS with various oxide buffer layers at 150° C. Thicker oxide buffer layer can improve the data retention. This suggests that $Al_2O_3$ causes charge leakage. FIG. 27 shows the read disturb test. The device can sustain a high gate voltage (>6 V) stress. FIG. 28 shows that the read disturb life time exceeds more than 1 M read cycles at Vread<7 V. FIG. 29 shows that the read disturb is slightly degraded with a thinner buffer layer, with substantial improvement occurring with a buffer oxide layer that is half or more of the thickness of the aluminum oxide capping layer. Therefore it is desirable to provide a relatively thicker buffer layer according to these results, as discussed above.

Figure 30:
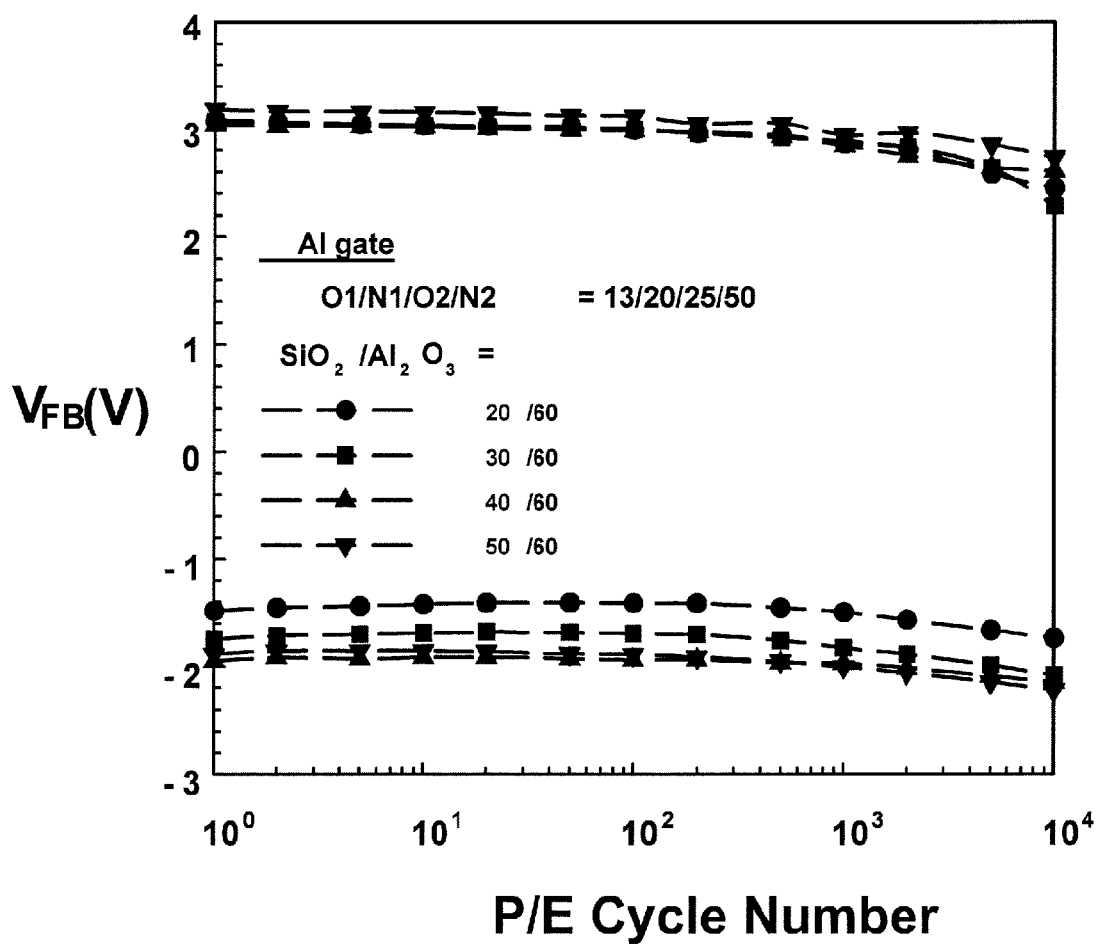
FIG. 30 shows cycle endurance of MA BE-SONOS with different thicknesses of $SiO_2$ buffer layers. All the devices can well maintain memory window after 10 K cycling stress.

FIG. 30 shows the cycle endurance of MA BE-SONOS with various $SiO_2$ buffer layer thicknesses. All the devices can well maintain memory window after 10,000 P/E cycles.

Figure 31:
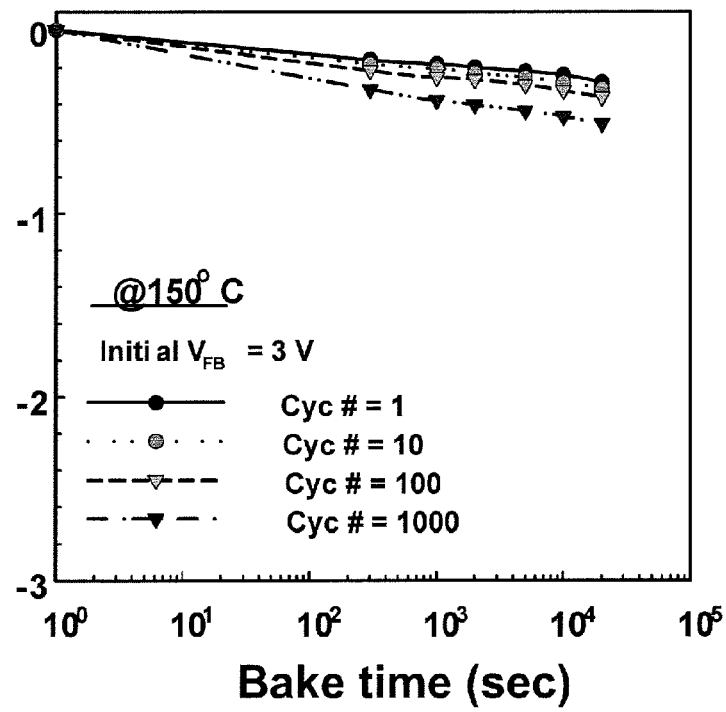
FIG. 31 shows retention characteristics of MA BE-SONOS with a 4 nm $SiO_2$ buffer layer after different P/E cycles, where all the devices are program to $V_{FB}=3V$ first and then baked at 150° C. The film stack of this sample is 13/20/25/50/40/60 with a Al metal gate.

The post-cycled retention of MA BE-SONOS (13/20/25/50/40/60) with a 40 Angstrom thick oxide buffer layer and a 60 Angstrom thick aluminum oxide capping layer is shown in FIG. 31, in which the devices were first programmed to a flat band voltage level of 3 V. The post-cycled device shows larger initial charge loss. However, the long-term retention becomes similar to the fresh state.

Figure 32:
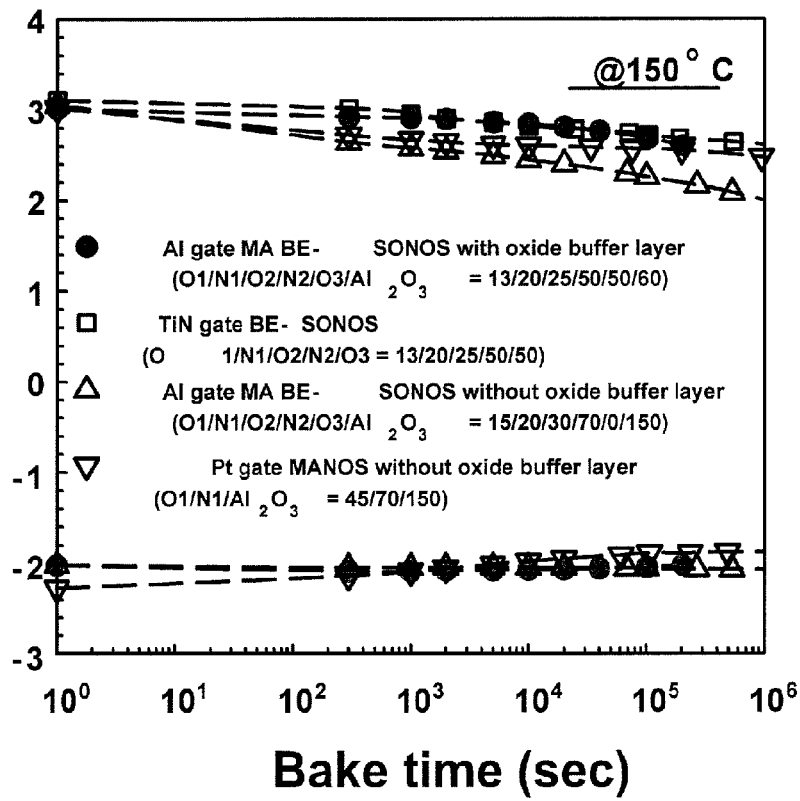
FIG. 32 shows retention comparison of MA BE-SONOS with oxide buffer layer (13/20/25/50/50/60), TiN gate BE-SONOS (13/20/25/50/50), MA BE-SONOS without oxide buffer layer, and MANOS without oxide buffer layer.

FIG. 32 compares the retention of various devices, including an aluminum gate, MA BE-SONOS device with a 50 Angstrom silicon dioxide buffer and a 60 Angstrom aluminum oxide capping layer, a TiN gate, BE-SONOS with 50 Angstrom silicon dioxide only blocking layer, an aluminum gate, MA BE-SONOS device without a silicon dioxide buffer but with an 150 Angstrom aluminum oxide capping layer, and a platinum gate MANOS device without a silicon dioxide buffer layer. It shows that TiN gate BE-SONOS shows the best retention performance. Both MANOS and MA BE-SONOS without oxide buffer layer show worse retention. This data suggests that $Al_2O_3$ directly contacting with nitride charge trapping layer causes charge leakage.

Figure 33:
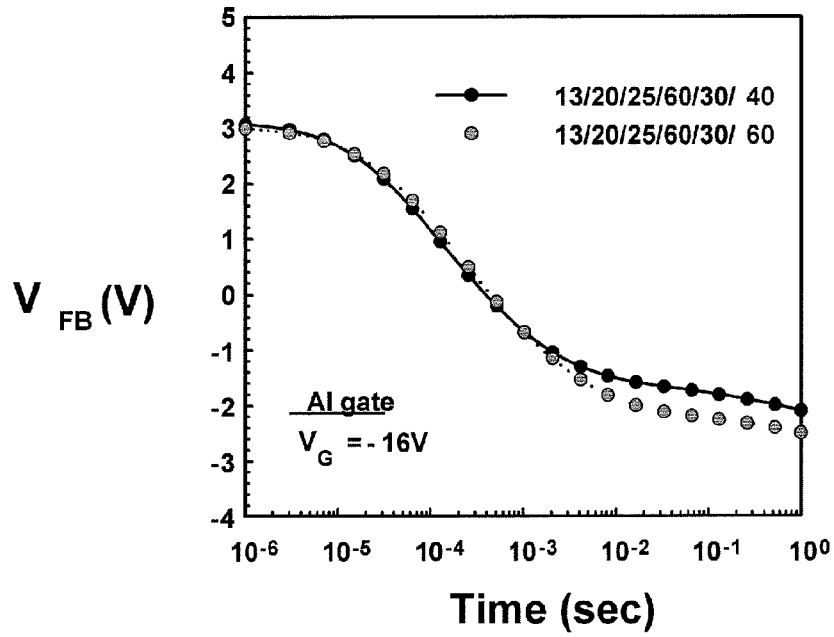
FIG. 33 shows erase characteristics of MA BE-SONOS with different $Al_2O_3$ thicknesses. Very thin $Al_2O_3$ (4 nm) top-capping layer shows successful erase performance, with low erase saturation level ($V_{FB}<-2$ V).
Figure 34:
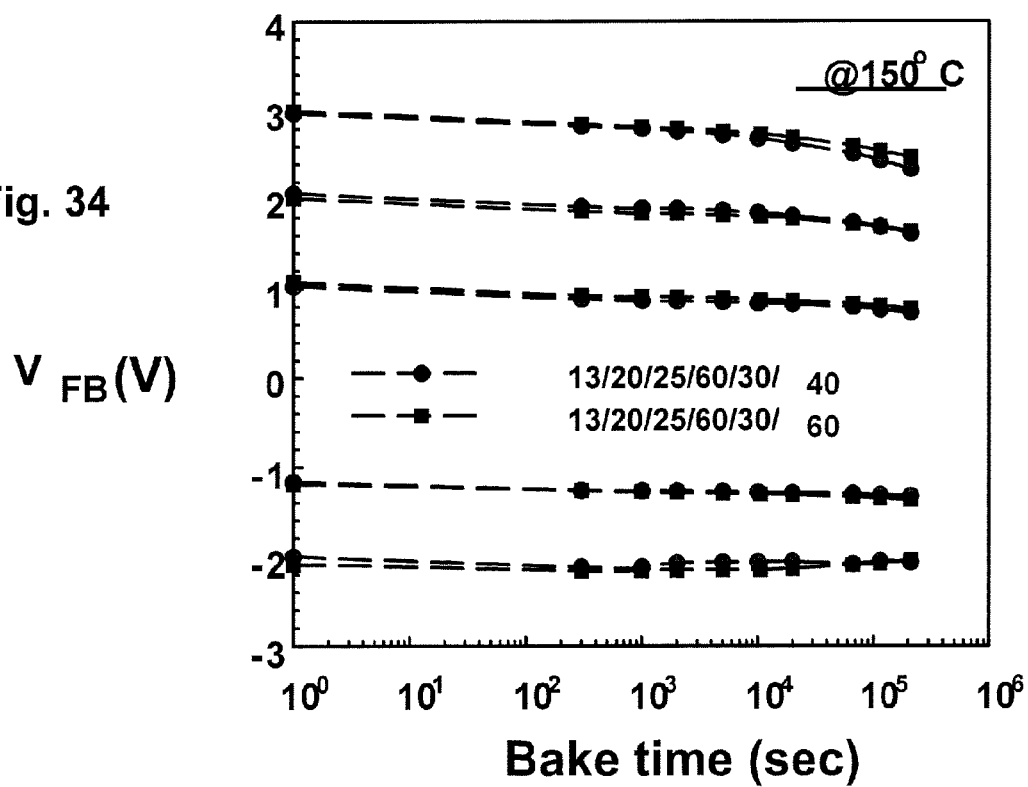
FIG. 34 shows bake retention of MA BE-SONOS with a $SiO_2$ buffer layer but various $Al_2O_3$ thicknesses at 150° C. The gate material is aluminum (Al).

The scaling capability of $Al_2O_3$ top dielectric was also investigated. In FIG. 33, various $Al_2O_3$ thickness in MA BE-SONOS are compared. It shows that both a 4 nm $Al_2O_3$ and 3 nm oxide buffer layer can maintain good erase performance. In FIG. 34, the 4 nm $Al_2O_3$ and 3 nm buffer oxide also possesses good data retention.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a charge trapping memory comprising:
defining a semiconductor body including a channel region on a semiconductor body, the channel region having a channel surface, and source and drain terminals adjacent the channel;
defining a gate;
forming a dielectric stack between the channel surface and the gate, including forming a tunneling dielectric layer on one of the channel surface and the gate; forming a charge trapping dielectric layer on the tunneling dielectric layer; and forming a blocking dielectric layer on the charge trapping dielectric layer, wherein forming the blocking dielectric layer includes forming a first layer of material having a dielectric constant $\kappa_1$ in contact with the charge trapping dielectric layer and forming a second layer of material having a dielectric constant $\kappa_2$ in contact with the other of the channel surface and the gate, where $\kappa_2$ is greater than $\kappa_1$, and the second layer has thickness less than $\kappa_2/\kappa_1$ times that of the first layer.

2. The method of claim 1, wherein the dielectric stack has an effective oxide thickness EOT of less than 160 Angstroms, the tunneling dielectric layer has an effective oxide thickness EOT between about 40 and 55 Angstroms and the blocking dielectric layer has an effective oxide thickness EOT of less than 95 Angstroms.

3. The method of claim 1, wherein the tunneling dielectric layer comprises a combination of materials having negligible charge trapping efficiency, and arranged to establish a relatively low valence band energy level near the channel surface, and an increase in valence band energy level at a first offset from the channel surface and an decrease in valence band energy at a second offset more than 2 nm from the channel surface.

4. The method of claim 1, wherein the dielectric constant of the second layer is greater than 7.

5. The method of claim 1, wherein the gate comprises a metal, a metal compound, n+ doped polysilicon or p+ doped polysilicon.

6. The method of claim 1, wherein the tunneling dielectric layer comprises a first silicon oxide layer adjacent the channel and having a thickness of 18 Å or less, a silicon nitride layer on the first silicon oxide layer having a thickness of 30 Å or less, and a silicon oxide layer on the silicon nitride layer having a thickness of 35 Å or less.

7. The method of claim 1, wherein the tunneling dielectric layer comprises a single layer of silicon dioxide or silicon oxynitride having a thickness from about 3 to 5 nm.

8. A method of forming a memory device, comprising:
providing a substrate;
forming a first dielectric layer over the substrate;

forming a charge storage layer over the first dielectric layer;

forming a second dielectric layer over the charge storage layer;

forming a third dielectric layer over the second dielectric layer, wherein the third layer has a thickness and a dielectric constant both of which are greater than those of the second dielectric layer; and forming a metal gate over the third dielectric layer.

9. The method of claim 8, wherein in combination the first dielectric layer, the charge storage layer, the second dielectric layer and the third dielectric layer have an effective oxide thickness EOT of less than 31 nanometers.

10. The method of claim 8, wherein the first dielectric layer comprises a combination of materials having negligible charge trapping efficiency, and arranged to establish a relatively low valence band energy level near the channel surface, and an increase in valence band energy level at a first offset from the channel surface and an decrease in valence band energy at a second offset more than 2 nm from the channel surface.

11. The method of claim 8, wherein the dielectric constant of the third dielectric layer is greater than 7.

12. The method of claim 8, wherein the first dielectric layer comprises a first silicon oxide layer adjacent the channel and having a thickness of 18 Å or less, a silicon nitride layer on the first silicon oxide layer having a thickness of 30 Å or less, and a silicon oxide layer on the silicon nitride layer having a thickness of 35 Å or less.

13. The method of claim 8, wherein the first dielectric layer comprises a single layer of silicon dioxide or silicon oxynitride having a thickness from about 3 to 5 nm.

\* \* \* \* \*